US 11,658,219 B2

(12) United States Patent
Kawasaki et al.

(10) Patent No.: US 11,658,219 B2
(45) Date of Patent: May 23, 2023

(54) SEMICONDUCTOR DEVICE

(71) Applicant: ROHM CO., LTD., Kyoto (JP)

(72) Inventors: Kazuki Kawasaki, Kyoto (JP); Yuki Inoue, Kyoto (JP); Yusuke Yoshii, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 147 days.

(21) Appl. No.: 17/371,301

(22) Filed: Jul. 9, 2021

(65) Prior Publication Data

US 2022/0013646 A1 Jan. 13, 2022

(30) Foreign Application Priority Data

Jul. 13, 2020 (JP) .............................. JP2020-120087

(51) Int. Cl.
*H01L 29/417* (2006.01)
*H01L 23/49* (2006.01)

(52) U.S. Cl.
CPC ........ *H01L 29/41725* (2013.01); *H01L 23/49* (2013.01)

(58) Field of Classification Search
CPC . H01L 23/49838–49844; H01L 29/41–42396; H01L 29/66696; H01L 29/66727; H01L 29/41741

See application file for complete search history.

(56) References Cited

U.S. PATENT DOCUMENTS

| 5,672,894 A * | 9/1997 | Maeda ............... H01L 29/41758 |
| | | 257/341 |
| 2008/0093638 A1* | 4/2008 | Kobayashi ............ H01L 29/808 |
| | | 257/E27.069 |

FOREIGN PATENT DOCUMENTS

JP 2012156205 A 8/2012

* cited by examiner

*Primary Examiner* — Laura M Menz
*Assistant Examiner* — Candice Chan
(74) *Attorney, Agent, or Firm* — Rabin & Berdo, P.C.

(57) ABSTRACT

The present disclosure provides a semiconductor device capable of reducing wiring resistance by using a stripe wire. The semiconductor device includes: a source pad electrode formed on a second interlayer insulating layer; a plurality of source extraction electrodes extracted in a first direction from the source pad electrode; a drain pad electrode formed on the second interlayer insulating layer; and a plurality of drain extraction electrodes extracted in the first direction from the drain pad electrode. The source pad electrode and the plurality of source extraction electrodes are electrically connected to a plurality of source wires of stripe wire covered by the second interlayer insulating layer. The drain pad electrode and the plurality of drain extraction electrodes are electrically connected to a plurality of drain wires of the stripe wire. The plurality of drain extraction electrodes are engaged with the plurality of source extraction electrodes.

20 Claims, 21 Drawing Sheets

SEMICONDUCTOR DEVICE

BACKGROUND OF THE INVENTION

Field of the Invention

The present invention relates to a semiconductor device.

Description of the Prior Art

Patent document 1 discloses a semiconductor device, which has a striped drain region and source region formed as extending in a direction on a main surface of a body region thereof.

Prior Art Document

Patent Publication

[Patent document 1] Japan Patent Publication No. 2012-156205

SUMMARY OF THE INVENTION

Problems to be Solved by the Disclosure

The following situation is discussed: configuring a first wiring layer spaced by an insulating layer (first insulating layer) on a body region, and configuring a second wiring layer spaced by an insulating layer (second insulating layer) on the first wiring layer. The second wiring layer includes a first pad electrode and a second pad electrode. In this case, it is considered that, in the first wiring layer, a plurality of first wires (source wires) and a plurality of second wires (drain wires) extending in strip directions of a drain region and a source region are formed into stripes at intervals. That is, it is considered that, in the first wiring layer, stripe wire is formed in the stripe directions of the drain region and the source region.

In this case, if the first electrode pad is electrically connected to one end portion of the stripe wire and the second pad electrode is electrically connected to the other end portion of the stripe wire, the current path from the first pad electrode to (a region on the side of the other end portion of) the stripe wire is increased, causing a concern of increased wiring resistance of the stripe wire. Similarly, the current path from the second pad electrode to (a region on the side of one end portion of) the stripe wire is increased, causing a concern of increased wiring resistance of the stripe wire.

A semiconductor device capable of reducing wiring resistance caused by stripe wire is provided according to an embodiment of the present invention.

Technical Means for Solving the Problem

A semiconductor device provided according to an embodiment of the present invention includes: a first insulating layer; stripe wire, including a plurality of first wires and a plurality of second wires, wherein the plurality of first wires and the plurality of second wires extend in a first direction on the first insulating layer and are arranged at intervals in a second direction intersecting the first direction, and the stripe wire has a first end portion on one side of the first direction and a second end portion on the other side in the first direction; a second insulating layer, covering the stripe wire on the first insulating layer; a first pad electrode, configured on a side of the first end portion of the stripe wire on the second insulating layer, and electrically connected to the plurality of first wires; a plurality of first extraction electrodes, extracted in a comb-like manner from the first pad electrode to a side of the second end portion of the stripe wire on the second insulating layer, and electrically connected to the plurality of first wires on the side of the second end portion of the stripe wire relative to the first pad electrode; a second pad electrode, configured on the side of the second end portion of the stripe wire on the second insulating layer, and electrically connected to the plurality of second wires; and a plurality of second extraction electrodes, extracted, engagingly with the plurality of first extraction electrodes on the second insulating layer, in a comb-like manner from the second pad electrode to the side of the first end portion of the stripe wire, and electrically connected to the plurality of second wires on the side of the first end portion of the stripe wire relative to the second pad electrode.

According to the semiconductor device, the current path from the first pad electrode to the stripe wire can be shortened by using the first extraction electrodes. Similarly, the current path from the second pad electrode to the stripe wire can be shortened by using the second extraction electrodes. Thus, wiring resistance can be reduced.

A semiconductor device provided according to an embodiment of the present invention includes: a first insulating layer; stripe wire, including a plurality of first wires and a plurality of second wires, wherein the plurality of first wires and the plurality of second wires extend in a first direction on the first insulating layer and are arranged at intervals in a second direction intersecting the first direction, and the stripe wire has a first end portion on one side of the first direction and a second end portion on the other side in the first direction; a second insulating layer, covering the stripe wire on the first insulating layer; a first pad electrode, configured on a side of the first end portion of the stripe wire on the second insulating layer, and electrically connected to the plurality of first wires; a first extraction electrode, extracted in the first direction from the first pad electrode to a side of the second end portion of the stripe wire on the second insulating layer, and electrically connected to the plurality of first wires on the side of the second end portion of the stripe wire relative to the first pad electrode; a second pad electrode, configured on the side of the second end portion of the stripe wire on the second insulating layer, and electrically connected to the plurality of second wires; and a second extraction electrode, extracted in the first direction from the second pad electrode to the side of the first end portion of the stripe wire on the second insulating layer, and electrically connected to the plurality of second wires on the side of the first end portion of the stripe wire relative to the second pad electrode; wherein, one between the first extraction electrode and the second extraction electrode includes a protruding portion protruding toward one side of the second direction, and the other between the first extraction electrode and the second extraction electrode includes a recessed portion recessed toward the one side of the second direction and engaged with the protruding portion.

According to the semiconductor device, the current path from the first pad electrode to the stripe wire can be shortened by using the first extraction electrodes. Similarly, the current path from the second pad electrode to the stripe wire can be shortened by using the second extraction electrodes. By forming the protruding portion in at least one between the first extraction electrode and the second extraction electrode, the number of stripe wire can be increased with the shortened current path. Thus, wiring resistance can be reduced.

A semiconductor device provided according to an embodiment of the present invention includes: a first insulating layer; stripe wire, including a plurality of first wires and a plurality of second wires, wherein the plurality of first wires and the plurality of second wires extend in a first direction on the first insulating layer and are arranged at intervals in a second direction intersecting the first direction, the stripe wire has a first end portion on one side of the first direction and a second end portion on the other side in the first direction; a second insulating layer, covering the stripe wire on the first insulating layer; a first pad electrode, configured on a side of the first end portion of the stripe wire on the second insulating layer, and electrically connected to the plurality of first wires; a first extraction electrode, extracted in the first direction from the first pad electrode to a side of the second end portion of the stripe wire on the second insulating layer, and electrically connected to the plurality of first wires on the side of the second end portion of the stripe wire relative to the first pad electrode; a second pad electrode, configured on the side of the second end portion of the stripe wire on the second insulating layer, and electrically connected to the plurality of second wires; and a second extraction electrode, extracted in the first direction from the second pad electrode to the side of the first end portion of the stripe wire on the second insulating layer, and electrically connected to the plurality of second wires on the side of the first end portion of the stripe wire relative to the second pad electrode; wherein one between the first extraction electrode and the second extraction electrode includes: a first extension portion, extending in the first direction; a third extension portion, extending in the first direction from the first extension portion to the side of the second end portion or away from the side of the first end portion; and a connection portion, connecting the first extension portion and the third extension portion.

According to the semiconductor device, the current path from the first pad electrode to the stripe wire can be shortened by using the first extraction electrodes. Similarly, the current path from the second pad electrode to the stripe wire can be shortened by using the second extraction electrodes.

DETAILED DESCRIPTION OF THE EMBODIMENTS

Details of the embodiments of the present invention are given with the accompanying drawings below.

Figure 1:
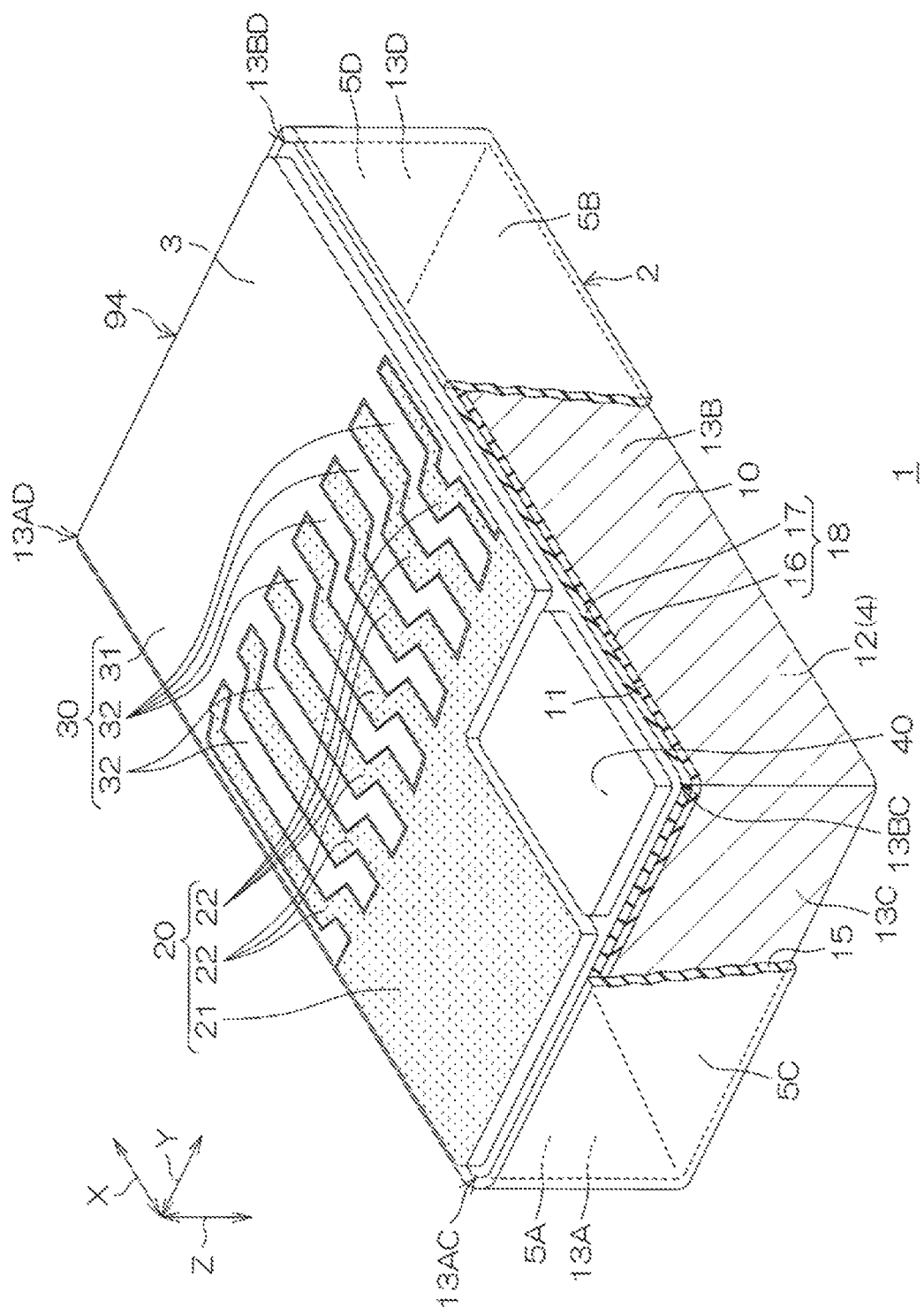
FIG. 1 is a notched three-dimensional schematic diagram of a semiconductor device according to an embodiment of the present invention.

FIG. 1 is a notched three-dimensional schematic diagram of a semiconductor device according to an embodiment of the present invention.

A semiconductor device 1 is a small-sized chip component such as a chip referred to as a 1005 (1 mm×0.5 mm) chip, 0603 (0.6 mm×0.3 mm) chip, 0402 (0.4 mm×0.2 mm) chip, or 03015 (0.3 mm×0.15 mm) chip based on planar dimensions.

The semiconductor device 1 includes a chip body 2 shaped as a cuboid. The chip body 2 also serves as a package. That is, the chip size of the semiconductor device 1 (the chip body 2) is the package size. The chip body 2 includes a first chip main surface 3 on one side, and a second chip main surface 4 on the other side. The first chip main surface 3 and the second chip main surface 4 are shaped as quadrilaterals (specifically, rectangles) when viewed in a normal direction Z thereof (to be referred to as "in top view" below). The first chip main surface 3 is a connection surface (mounting surface) that faces a connection target such as a substrate when mounted on the connection target. The second chip main surface 4 is a non-connection surface (non-mounting surface) opposite to the connection surface.

The second chip main surface 4 consists of a ground surface having grinding marks or a mirror.

The chip body 2 includes four chip side surfaces 5A to 5D connected to the first chip main surface 3 and the second chip main surface 4. The four chip side surfaces 5A to 5D include a first chip side surface 5A, a second chip side surface 5B, a third chip side surface 5C and a fourth chip side surface 5D. The first chip side surface 5A and the second chip side surface 5B extend in a first direction X, and are opposite in a second direction Y intersecting the first direction X. The first chip side surface 5A and the second chip side surface 5B form long sides of the chip body 2. The third chip side surface 5C and the fourth chip side surface 5D extend in the second direction Y, and are opposite in the first direction X. The third chip side surface 5C and the fourth chip side surface 5D form short sides of the chip body 2. The chip side surfaces 5A to 5D consists of flat surfaces extending in the normal direction Z. In the form above, the second direction Y is orthogonal to the first direction X.

The four corners of the chip body 2 form curves (R chamfers) toward outer sides of the chip body 2 in top view. The four corners of the chip body 2 may also be C chamfers. The four corners of the chip body 2 may also be edge angles instead of chamfers.

The terms "0603", "0402" and "03015" are defined by the length of the short sides and the length of the long sides of the chip body 2. The length of the short sides of the chip body 2 is not limited to the above values, and may be equal to or more than 0.05 mm and equal to or less than 1 mm. Furthermore, the length of the long sides of the chip body 2 is not limited to the above values, and may be equal to or more than 0.1 mm and equal to or less than 2 mm. The ratio of the length of the long sides of the chip body 2 to the length of the short sides of the chip body may also be equal to or more than 1 and equal to or less than 3. The chip body 2 may have a thickness of equal to or more than 50 μm and equal to or less than 1000 μm.

The semiconductor device 1 (the chip body 2) includes a cuboid semiconductor chip 10 made of silicon. The semiconductor chip 10 includes a first main surface 11 on one side, a second main surface 12 on the other side, and four side surfaces 13A, 13B, 13C and 13D connecting the first main surface 11 and the second main surface 12. The first main surface 11 and the second main surface 12 are shaped as quadrilaterals (as rectangles in this embodiment) in top view.

The first main surface 11 is a mounting surface on which functional apparatuses are formed. The second main surface 12 forms the second chip main surface 4. The four side surfaces 13A to 13D include a first side surface 13A, a second side surface 13B, a third side surface 13C and a fourth side surface 13D. Corners 13AC, 13AD, 13BC and 13BD of the semiconductor chip 10 are formed in respective intersecting portions of the adjacent side surfaces 13A to 13D on the first main surface 11.

The semiconductor chip 10 includes a p-type silicon substrate 56 (referring to FIG. 4 to FIG. 6B), and an n-type epitaxial layer 57 (referring to FIG. 4 to FIG. 6B). The epitaxial layer 57 is formed on the silicon substrate 56. The epitaxial layer 57 has a thickness of, for example, more than or equal to 5.0 μm and less than 10 μm.

The semiconductor device 1 further includes a side surface insulating layer 15 covering the side surfaces 13A to 13D of the semiconductor chip 10. The side surface insulating layer 15 comprehensively covers the four side surfaces 13A to 13D.

The semiconductor device 1 further includes an interlayer insulating layer 18 covering the first main surface 11. The interlayer insulating layer 18 includes a first interlayer insulating layer (first insulating layer) 16 and a second interlayer insulating layer (second insulating layer) 17. The interlayer insulating layer 18 has a layered structure in which the second interlayer insulating layer 17 overlaps on the first interlayer insulating layer 16. The side insulating layer 15 is connected to the first interlayer insulating layer 16 and the second interlayer insulating layer 17. That is, a peripheral portion of the first interlayer insulating layer 16 and a peripheral portion of the second interlayer insulating layer 17 are connected to the four side surfaces 13A to 13D.

The semiconductor device 1 includes a source terminal electrode 20, a drain terminal electrode 30 and a gate terminal electrode 40 on the first chip main surface 3. The source terminal electrode 20, the drain terminal electrode 30 and the gate terminal electrode 40 are formed on the second interlayer insulating layer 17.

The source terminal electrode 20 includes a source pad electrode (first pad electrode) 21, and a plurality of source extraction electrodes (first extraction electrodes) 22. The drain terminal electrode 30 includes a drain pad electrode (second pad electrode) 31, and a plurality of drain extraction electrodes (second extraction electrodes) 32.

Figure 2:
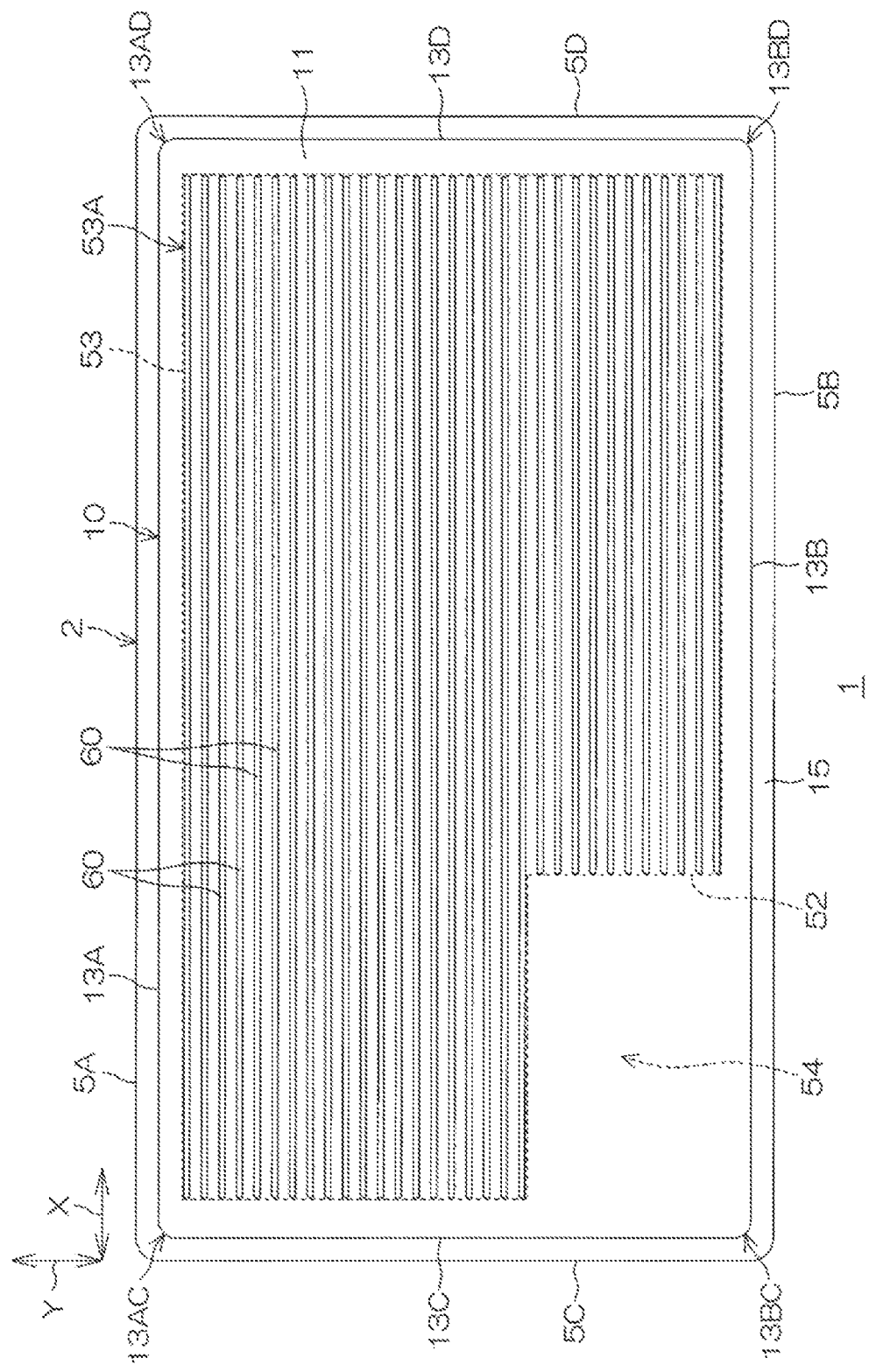
FIG. 2 is a top view of an internal structure of the semiconductor device and represents a layout of a first main surface of a semiconductor chip.
Figure 3:
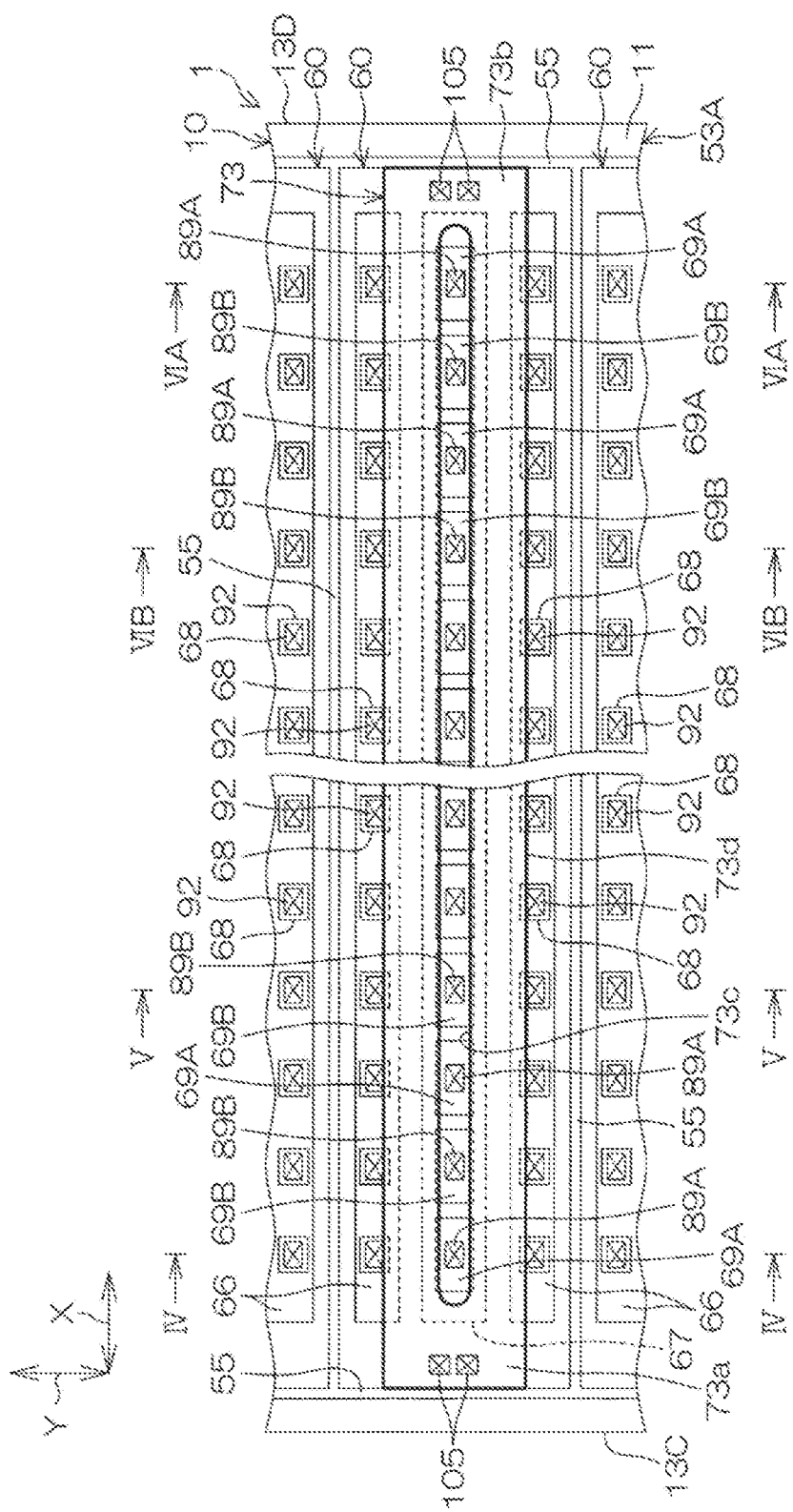
FIG. 3 is an enlarged diagram of a unit cell shown in FIG. 2.
Figure 4:
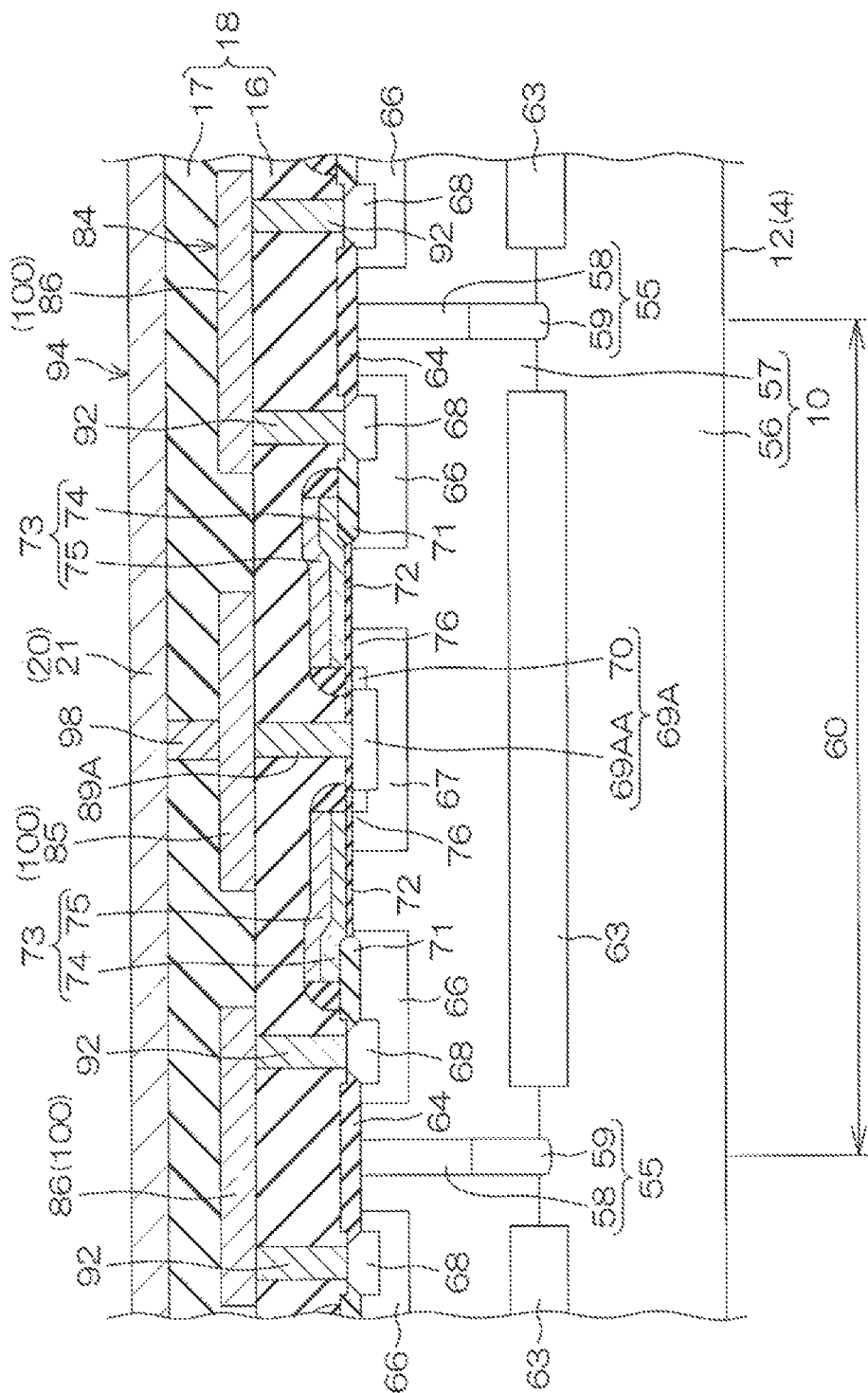
FIG. 4 is a section diagram along a section line IV-IV in FIG. 3.
Figure 5:
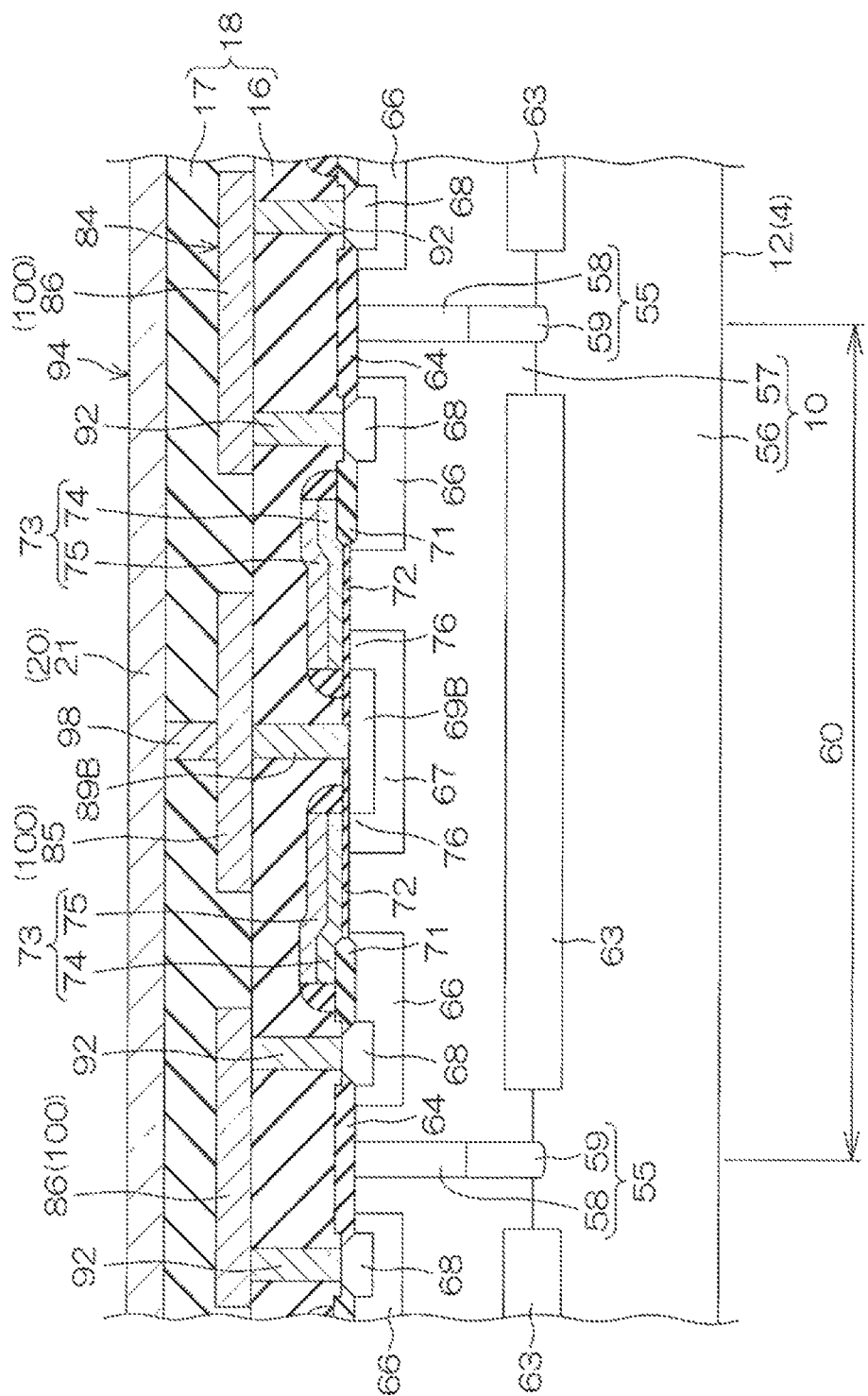
FIG. 5 is a section diagram along a section line V-V in FIG. 3.
Figure 6A:
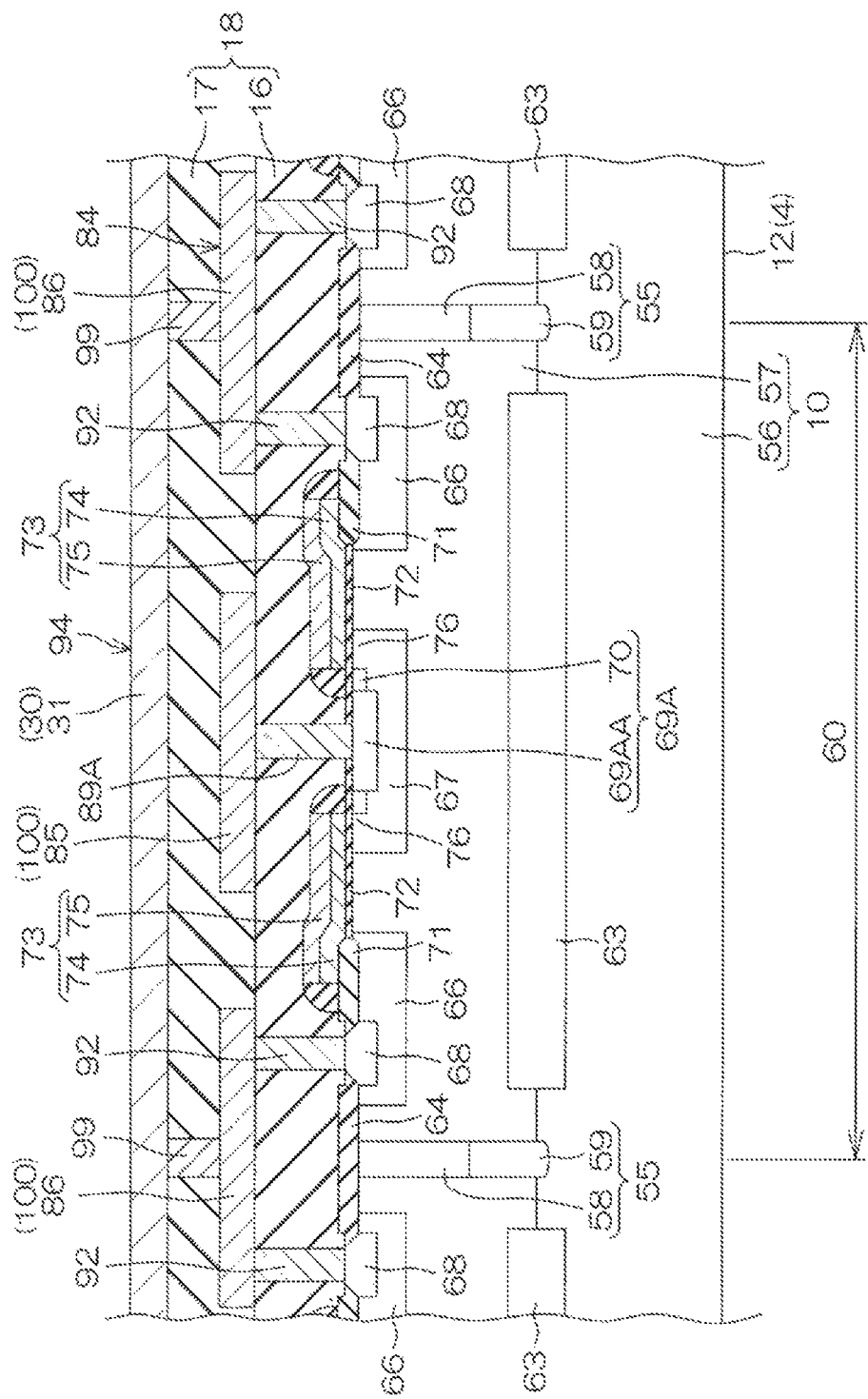
FIG. 6A is a section diagram along a section line VIA-VIA in FIG. 3.
Figure 6B:
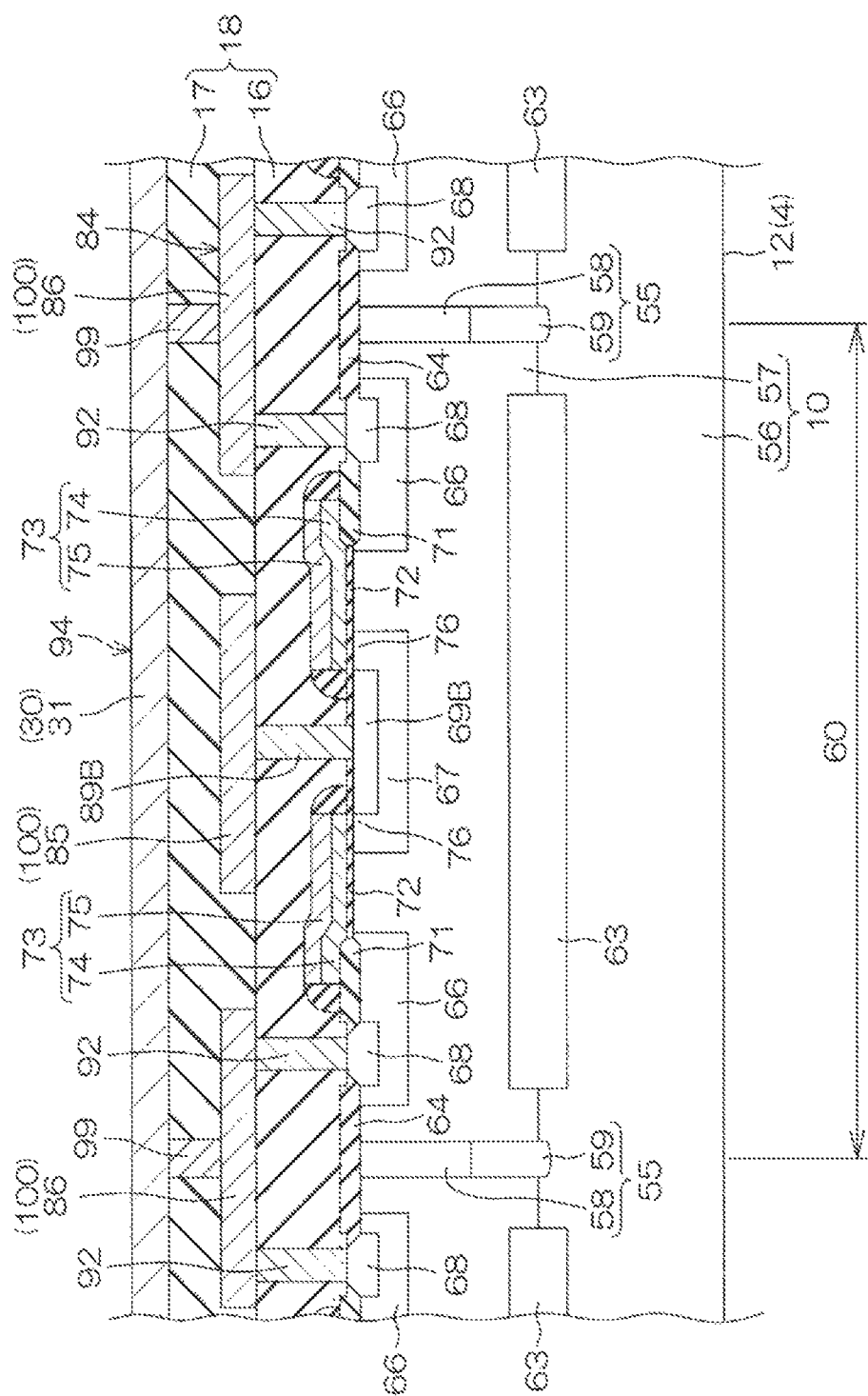
FIG. 6B is a section diagram along a section line VIB-VIB in FIG. 3.

FIG. 2 shows a top view of an internal structure of the semiconductor device, and represents a layout of a first main surface 11. FIG. 3 shows an enlarged diagram of a unit cell 60 shown in FIG. 2. FIG. 4 shows a section diagram along a section line IV-IV in FIG. 3. FIG. 5 shows a section diagram along a section line V-V in FIG. 3. FIG. 6A shows a section diagram along a section line VIA-VIA in FIG. 3. FIG. 6B shows a section diagram along a section line VIB-VIB in FIG. 3.

The internal structure of the semiconductor device 1 is described with reference to FIG. 2 to FIG. 6B below.

The semiconductor device 1 includes a first main surface 11, an active portion 53 formed on the first main surface 11, and a peripheral region 54 formed outside the source portion on the first main surface 11. As shown in FIG. 2, in the entire first main surface 11 of the semiconductor chip 10, the active portion 53 is in general formed on a part except for an inwardly recessed portion formed around one corner 13BC of the semiconductor chip 10, for example, the portion other than the recessed portion 52 shaped as a quadrilateral in top view. The peripheral region 54 is formed matchingly with the recessed portion 52. The active portion 53 is a region where a metal-oxide semiconductor field-effect transistor (MOSFET) structure 53A is formed. In this region, when the source-drain of the semiconductor device 1 is in a conducting state (turned on), current flows in a thickness direction of the semiconductor chip 10. The peripheral region 54 is a region where no MOSFET structure (equivalent to the MOSFET structure 53A) is formed. The peripheral region 54 functions as a support portion for supporting the gate terminal electrode 40 (referring to FIG. 1). The peripheral region 54 is a region where no MOSFET structure (equivalent to the MOSFET structure 53A) is formed. Elements (e.g., a protection diode) other than a MOSFET structure may also be formed in the peripheral region 54.

The MOSFET structure 53A is a field-effect transistor formed by a plurality of unit cells 60 arranged in the second direction Y and extending in the first direction X. The unit cell 60 has a planar gate structure.

As shown in FIG. 3, the unit cell 60 includes a double-diffused MOSFET (DMOSFET). The unit cell 60 includes a strip-like $n^-$-type well region 66 extending in the first direction X, and a strip-like p⁻-type body region 67 extending in the first direction X. The well region 66 and the body region 67 are formed at an interval in the second direction Y. The well region 66 and the body region 67 are formed as stripes extending in the first direction X of the semiconductor chip 10. In each unit cell 60, one body region 67 is sandwiched in the second direction Y by two well regions 66 adjacent to the body region 67.

As shown in FIG. 4 to FIG. 6B, the semiconductor chip 10 includes a p-type separation well 55 on the first main surface 11, and the p-type separation well 55 separates a part of the epitaxial layer 57 from other parts so as to define a drift region. The separation well 55 is shaped as a ring in top view, and is formed from a surface layer portion (the first main surface 11) of the epitaxial layer 57 to the silicon substrate 56. The unit cells 60 are divided by surrounding a part of the epitaxial layer 57 using the separation well 55 on the silicon substrate 56.

As shown in FIG. 4 to FIG. 6B, the separation well 55 includes a two-layer structure having a p⁺-type upper region 58 arranged on the upper side and a p⁻-type lower region 59 arranged on the lower side. A boundary between the regions 58 and 59 is set at an intermediate portion in the thickness direction of the epitaxial layer 57.

As shown in FIG. 4 to FIG. 6B, an n⁺-type embedded layer 63 is selectively formed in the unit cell 60. In the semiconductor chip 10, the embedded layer 63 is formed in a manner of crossing the boundary between the silicon substrate 56 and the epitaxial layer 57.

A field insulating film 64 is formed in the surface layer portion of the separation well 55. The field insulating film 64 is, for example, an oxide film.

As shown in FIG. 3 to FIG. 6B, an n⁺-type drain region 68 having an impurity concentration higher than that of the well region 66 is formed in the surface layer portion of the well region 66. The drain region 68 is a strip extending in the first direction X.

Moreover, as shown in FIG. 3, the surface layer portion of the body region 67 includes n⁺-type source regions 69A and p⁺-type contact regions 69B arranged alternately in the first direction X. The source regions 69A and the contact regions 69B are in overall a strip extending in the first direction X. As shown in FIG. 4 and FIG. 6A, the source region 69A includes a high-concentration region 69AA formed on an inner side and a low-concentration region 70 formed in a peripheral portion. The periphery of the high-concentration region 69AA is surrounded by the low-concentration region 70.

As shown in FIG. 5 and FIG. 6B, the outer periphery of the contact region 69B is arranged on a position spaced inwardly at a certain distance from the outer periphery of the body region 67.

As shown in FIG. 4 to FIG. 6B, in the surface layer portion of the epitaxial layer 57, a field insulating film 71 is formed on a part between the well region 66 and the body region 67. The field insulating film 71 is, for example, an oxide film.

One peripheral edge of the field insulating film 71 is arranged on the periphery of the drain region 68, and another peripheral edge of the field insulating film 71 is arranged on the well region 66 which is spaced inwardly by a certain interval from the outer periphery of the well region 66. The drain region 68 is formed in a region between the periphery of the field insulating film 71 and the field insulating film 64.

Moreover, in the surface layer portion of the epitaxial layer 57, a gate insulating film 72 is formed in a manner of crossing the epitaxial layer 57 and the body region 67.

Further, a gate electrode 73 is formed on the gate insulating film 72. The gate electrode 73 is formed as selectively covering a part of the gate insulating film 72 and a part of the field insulating film 71.

The gate electrode 73 is shaped as a quadrilateral in top view. As shown in FIG. 3, the gate electrode 73 extends in the first direction X in top view. The gate electrode 73 has an end portion 73a and another end portion 73b. The gate electrode 73 further has an outer peripheral wall 73c and an inner peripheral wall 73d. The outer peripheral wall 73c is shaped as a quadrilateral in top view. The inner peripheral wall 73d is shaped as an ellipsoid in top view. The source region 69A and the contact region 69B are exposed from an opening defined by the inner peripheral wall 73d.

As shown in FIG. 4 to FIG. 6B, the gate electrode 73 may also include a polysilicon-containing lower film 74 and a tungsten silicide/silicon-containing upper film 75. The gate insulating film 72 may also be an oxide film.

The gate electrode 73 is spaced by the gate insulating film 72 such that a region opposite to the main region 67 is a channel region 76. Formation of the channel of the channel region 76 is controlled by the gate electrode 73.

Moreover, as shown in FIG. 4 to FIG. 6B, the semiconductor device 1 further includes an interlayer insulating layer 18. The interlayer insulating layer 18 includes the first interlayer insulating layer 16 and the second interlayer insulating layer 17. The first interlayer insulating layer 16 and the second interlayer insulating layer 17 are formed in a manner of covering the first main surface 11 of the semiconductor chip 10. The first interlayer insulating layer 16 and the second interlayer insulating layer 17 are formed by an insulating material, for example, SiO2. The first interlayer insulating layer 16 covers a plurality of unit cells 60.

Figure 7:
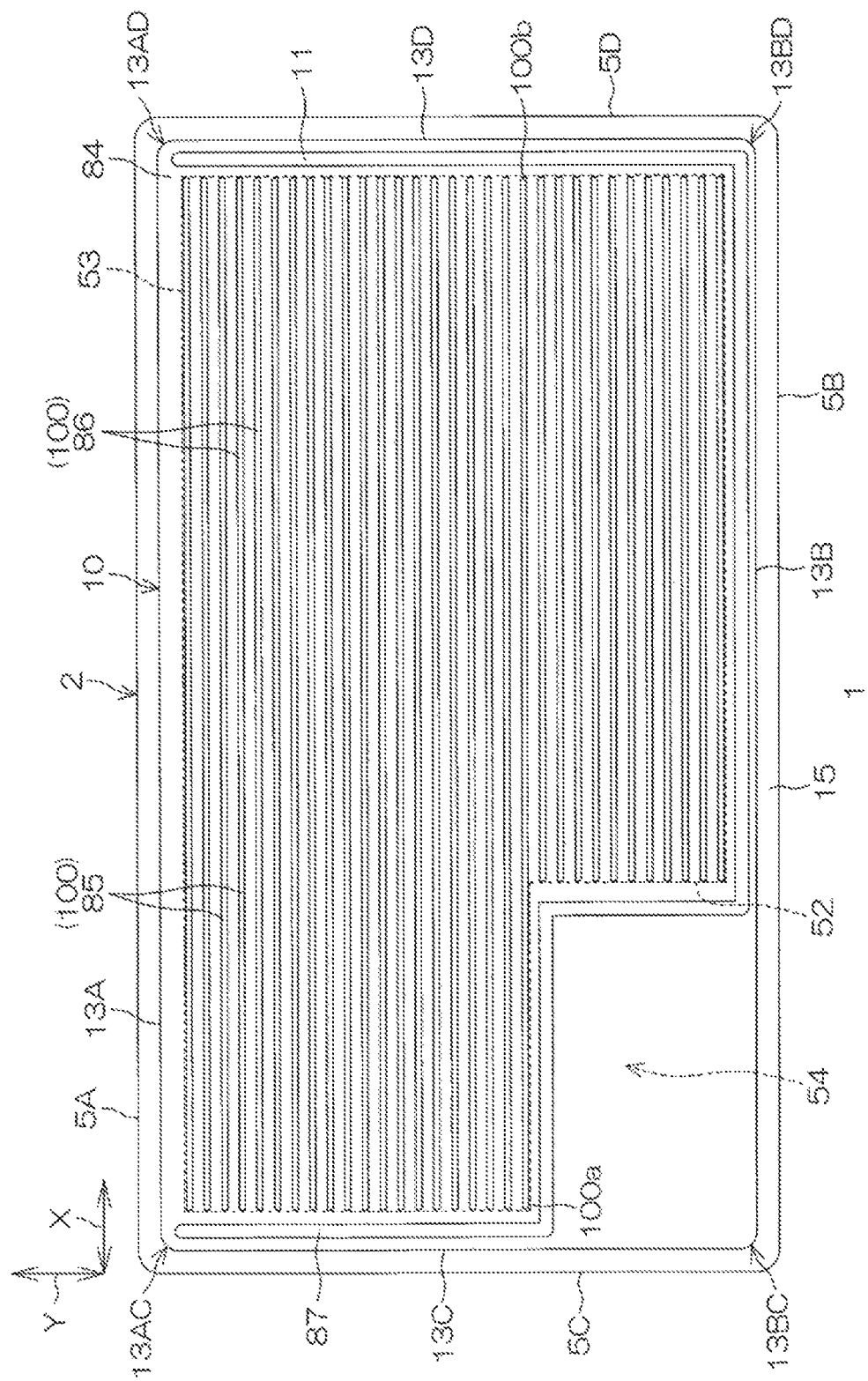
FIG. 7 is a diagram of an internal structure of the semiconductor device and is primarily for illustrating a layout of a first wiring layer.
Figure 8:
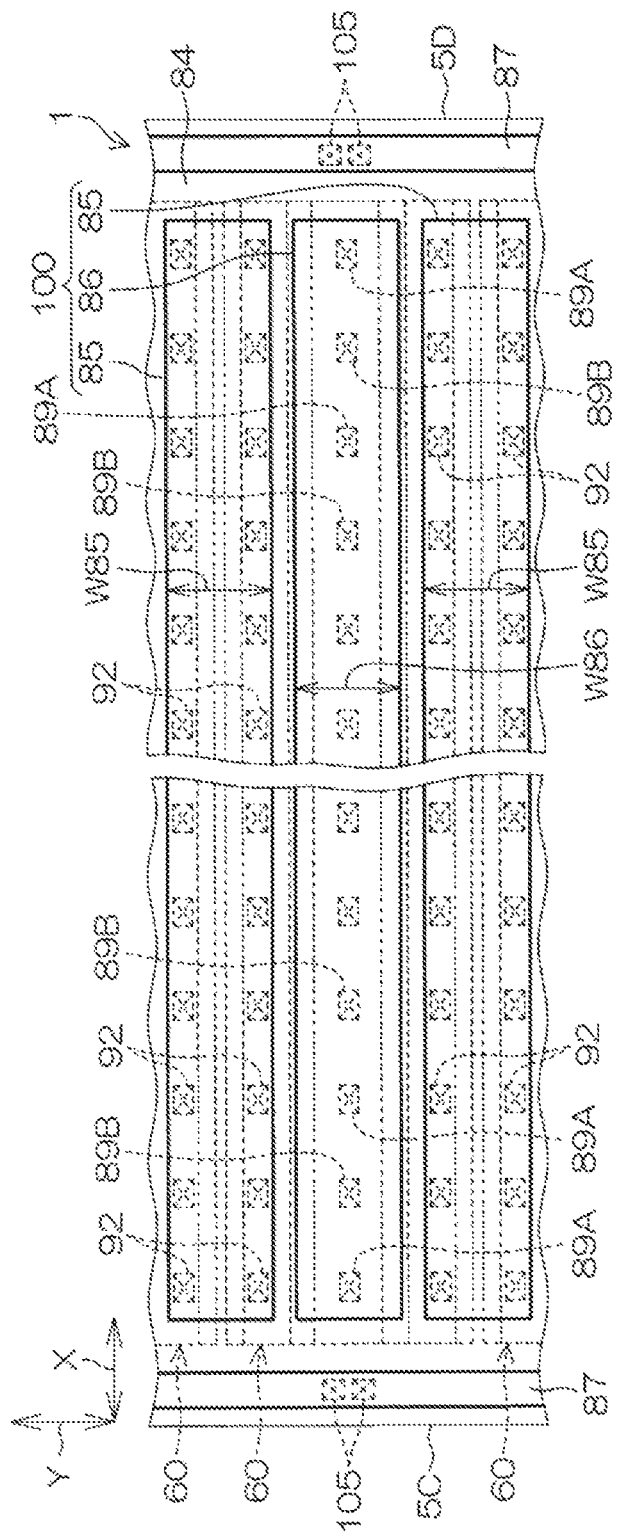
FIG. 8 is a diagram corresponding to FIG. 3 and is primarily for illustrating a layout of a first wiring layer.

FIG. 7 shows a diagram of an internal structure of the semiconductor device 1, and is primarily for illustrating a layout of a first wiring layer 84. FIG. 8 shows a diagram corresponding to FIG. 3, and is primarily for illustrating a layout of the first wiring layer 84.

As shown in FIG. 4 to FIG. 8, the first wiring layer 84 is formed on the first interlayer insulating layer 16. The first wiring layer 84 includes stripe wire 100. The stripe wire 100 includes a plurality of pairs of source wires (first wires) 85 and drain wires (second wires) 86. The plurality of source wires 85 and the plurality of drain wires 86 are arranged at intervals in the second direction Y. The plurality of source wires 85 and the plurality of drain wires 86 are formed as stripes extending in the first direction X, and are alternately arranged. The stripe wire 100 has a first end portion 100a on the side of the third chip side surface 5C (referring to FIG. 7) and a second end portion 100b on the side of the fourth chip side surface 5D. The stripe wire 100 forms substantially all the region except for the peripheral region 54 in top view.

The source wire 85 includes a main electrode formed of a metal layer. The metal layer includes pure Cu, pure Al (having a purity of 99% or more), AlSi, AlCu and AlSiCu. A first barrier layer and a second barrier layer may also be formed on the front surface and the back surface of the main electrode, respectively. The first barrier layer and the second barrier layer include at least one of Ti and TiN. The main electrode may also have a thickness greater than those of the first barrier layer and the second barrier layer.

The source wire 85 is connected to the source region 69A and the contact region 69B formed in the body region 67 via a plurality of source lower contacts 89A and a plurality of source lower contacts 89B. The source region 69A is connected to the source wire 85 via the corresponding source lower contact 89A. In the contact region 69B, connection to the source wire 85 is established via the corresponding lower contact 89B. As shown in FIG. 3, the source lower contact 89A and the source lower contact 89B are alternately arranged in the first direction X. The plurality of source lower contacts 89A and the plurality of source lower contacts 89B are in overall arranged in the first direction X. The source lower contact 89A and the source lower contact 89B include a metal layer such as tungsten. A barrier layer (for example, including at least one of Ti and TiN) may also be formed on at least one of the front surface, the back surface and the side surface of the metal layer according to requirements.

The drain wire 86 includes a main electrode formed of a metal layer. The metal layer includes pure Cu, pure Al (having a purity of 99% or more), AlSi, AlCu and AlSiCu. A first barrier layer and a second barrier layer may also be formed on the front surface and the back surface of the main electrode, respectively. The first barrier layer and the second barrier layer include at least one of Ti and TiN. The main electrode may also have a thickness greater than those of the first barrier layer and the second barrier layer.

The drain wire 86 is connected to the drain region 68 formed in the well region 66 via a plurality of drain lower contacts 92. The plurality of drain lower contacts 92 are arranged in the first direction X. The drain lower contacts 92 are opposite to the source lower contacts 89A and 89B in the second direction Y. The drain lower contact 92 includes a metal layer such as tungsten. A barrier layer (for example, including at least one of Ti and TiN) may also be formed on at least one of the front surface, the back surface and the side surface of the metal layer according to requirements.

As shown in FIG. 8, the drain wire 86 is connected to both of the drain region 68 of the well region 66 of the unit cell 60 on one side of the Y direction, and the drain region 68 of the well region 66 of the unit cell 60 on the other side in the Y direction and adjacent to the unit cell 60 on the one side of the Y direction. That is, the drain wire 86 is commonly connected to the drain regions 68 of two well regions 66 included in the adjacent unit cells 60. A width W86 of the drain wire 86 in the second direction Y is equal to a width W85 of the source wire 85 in the second direction Y. The width W86 of the drain wire 86 in the second direction Y may also be greater than the width W85 of the source wire 85 in the second direction Y. A width W86 of the drain wire 86 in the second direction Y may also be smaller than the width W85 of the source wire 85 in the second direction Y.

The first wiring layer 84 further includes a gate wire 87. As shown in FIG. 7, the gate wire extends as a strip along the periphery of the active portion 53. The gate wire 87 is not formed on the side of the first side surface 13A of the active portion 53 (that is, the side of the first chip side surface 5A). As shown in FIG. 8, the gate wire 87 is connected to the gate electrode 73 via a gate lower contact 105. The gate lower contact 105 is formed on an end portion 73a (referring to FIG. 3) and another end portion 73b of the gate electrode 73 extending in the first direction X. The gate lower contact 105 is not formed in a center portion (the region other than the end portion 73a and the end portion 73b) of the gate electrode 73. The gate lower contact 105 includes a metal layer such as tungsten. A barrier layer (for example, including at least one of Ti and TiN) may also be formed on at least one of the front surface, the back surface and the side surface of the metal layer according to requirements.

As shown in FIG. 4 to FIG. 6B, the top wiring layer 94 is formed on the second interlayer insulating layer 17. In the pattern above, as shown in FIG. 1, the top wiring layer 94 is formed on the first chip main surface 3 of the semiconductor device 1. That is, the second interlayer insulating layer 17 is the uppermost interlayer film, and is thus referred to as the top wiring layer 94. However, when such a third interlayer insulating layer is formed on the second interlayer insulating layer 17, the wiring layer of the second interlayer insulating layer 17 may also be referred to as a second wiring layer.

Figure 9:
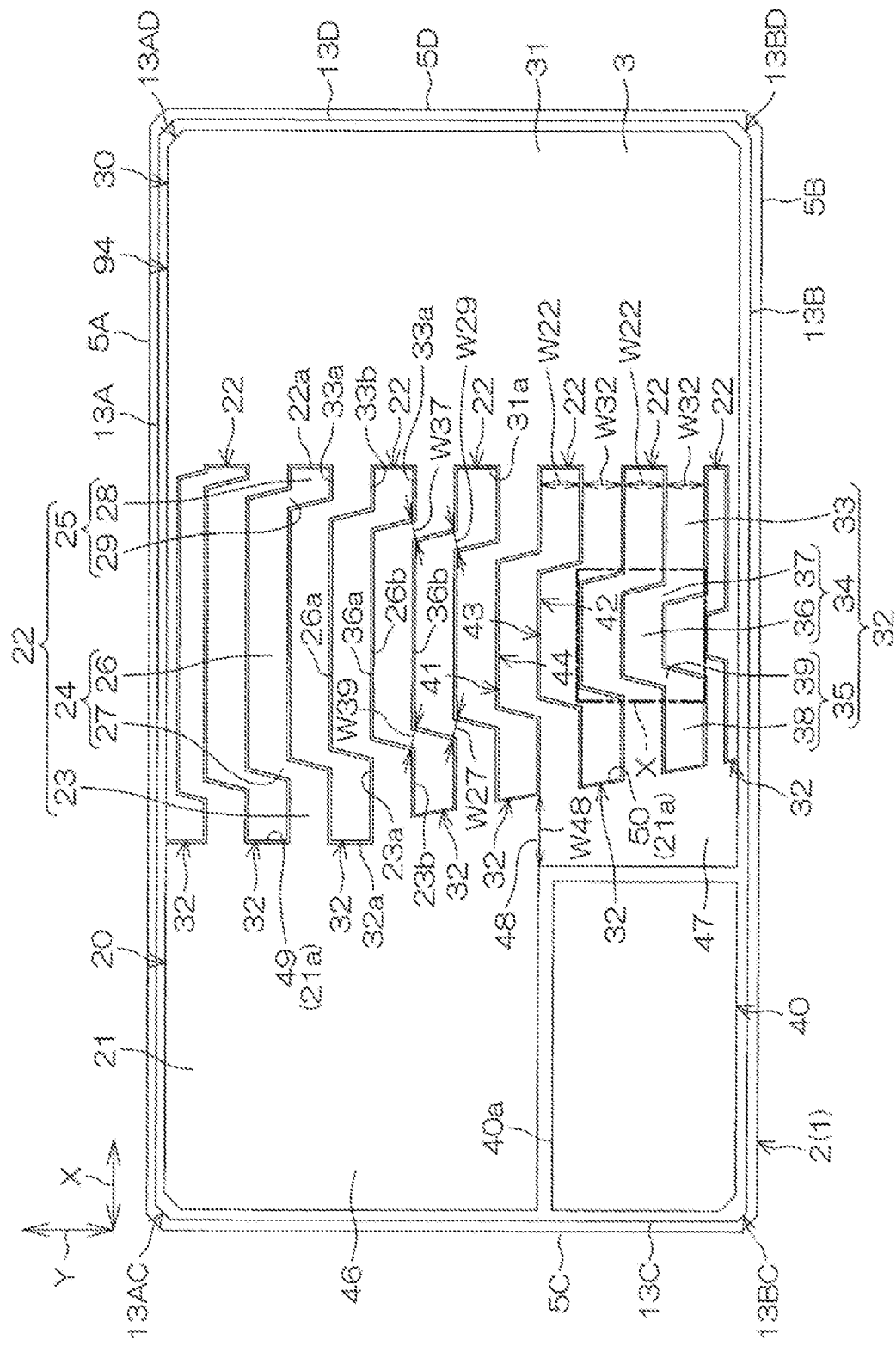
FIG. 9 is a diagram of an internal structure of the semiconductor device and is primarily for illustrating a layout of a top wiring layer.
Figure 10:
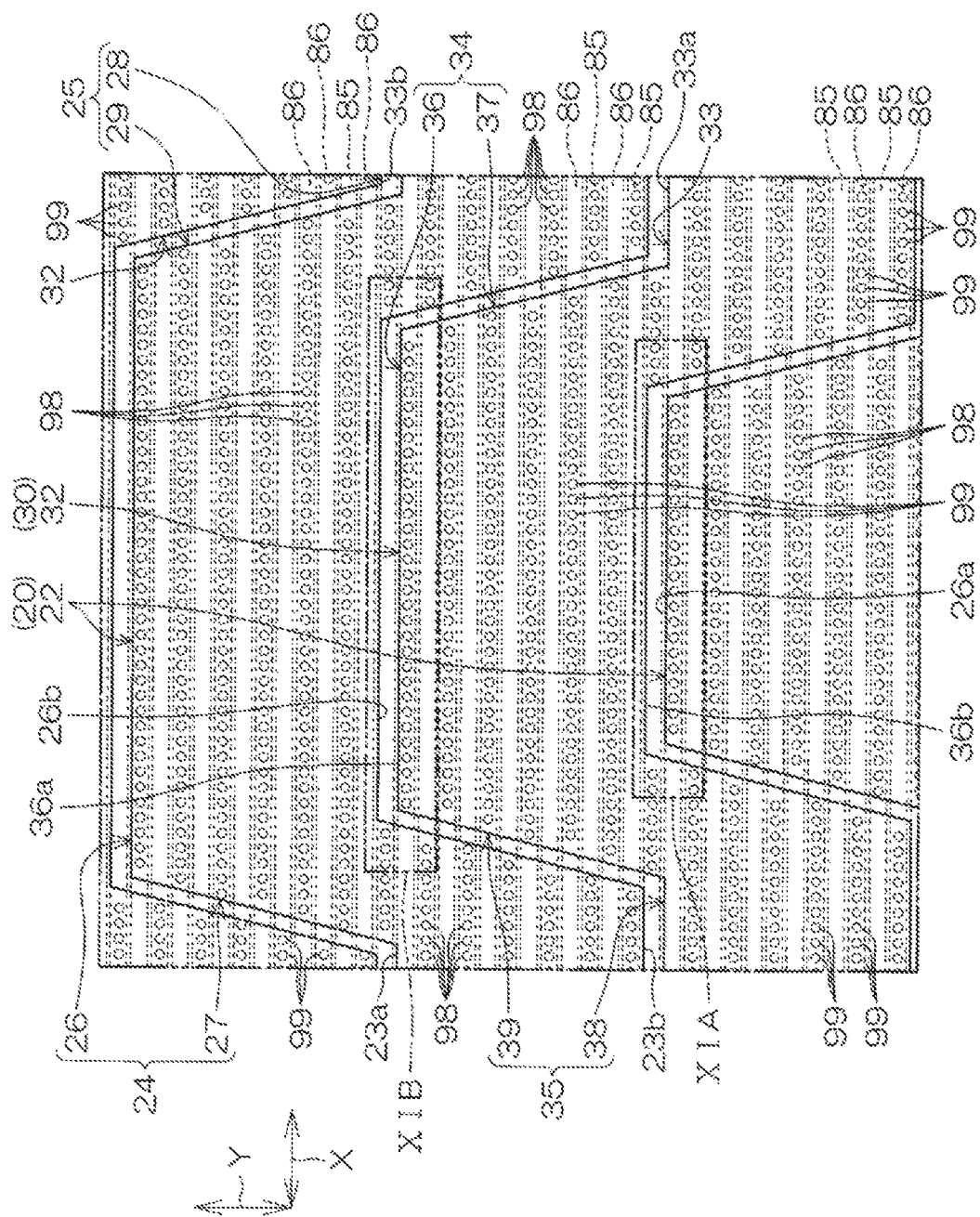
FIG. 10 is an enlarged diagram of an area X shown in FIG. 9.
Figure 11A:
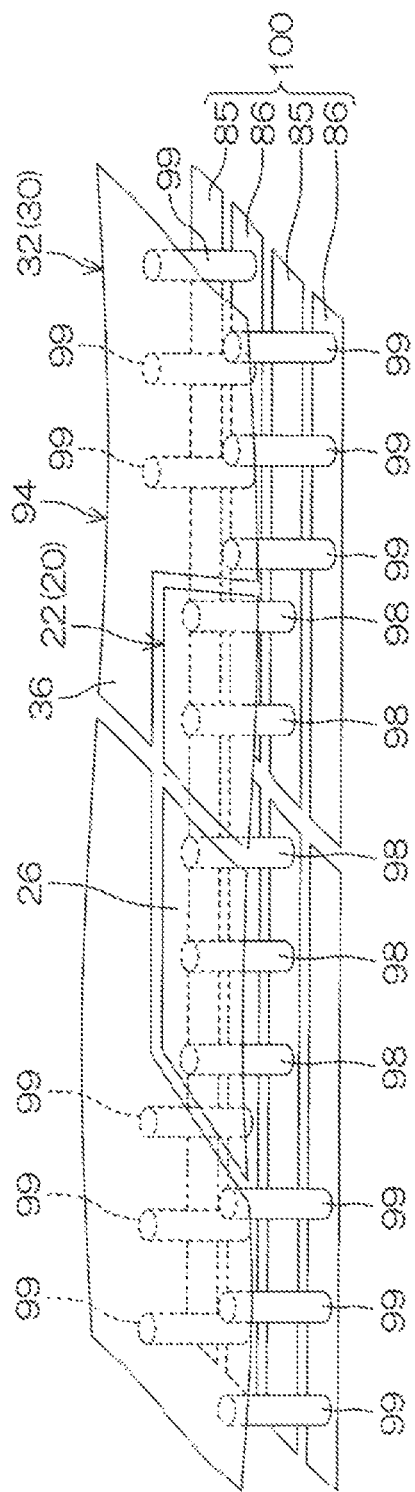
FIG. 11A is an enlarged three-dimensional diagram of the area XIA shown in FIG. 10 and is primarily for illustrating the relation between the first wiring layer and the top wiring layer.
Figure 11B:
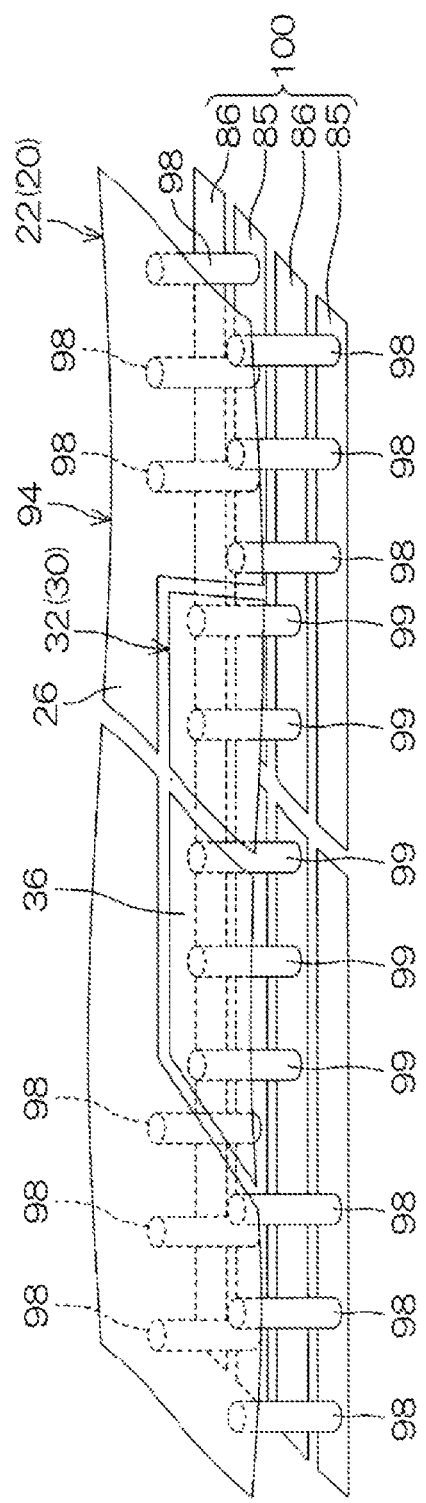
FIG. 11B is an enlarged three-dimensional diagram of the area XIB shown in FIG. 10 and is primarily for illustrating the relation between the first wiring layer and the top wiring layer.

FIG. 9 shows a diagram of an internal structure of the semiconductor device 1, and is primarily for illustrating a layout of the top wiring layer 94. FIG. 10 shows an enlarged diagram of an area X shown in FIG. 9. FIG. 11A shows an enlarged three-dimensional diagram of the area XIA shown in FIG. 10, and is primarily for illustrating the relation between the first wiring layer 84 and the top wiring layer 94. FIG. 11B shows an enlarged three-dimensional diagram of the area XIB shown in FIG. 10, and is primarily for illustrating the relation between the first wiring layer 84 and the top wiring layer 94. FIG. 11 shows an enlarged three-dimensional diagram of an area XI shown in FIG. 10.

As described above, the top wiring layer 94 includes the source terminal electrode 20, the drain terminal electrode 30 and the gate terminal electrode 40.

As described above, the source terminal electrode 20 includes the source pad electrode 21 and the plurality of source extraction electrodes 22. The source terminal electrode 20 is formed in a manner of overlapping with the active region 53 (referring to FIG. 2) and the stripe wire 100 in top view. The plurality of source extraction electrodes 22 are extracted in a comb-like manner extending in the first direction X to the side of the fourth chip side surface 5D. As shown in FIG. 9, the plurality of source extraction electrodes 22 may also be extracted in the second direction Y from the entire region of the source pad electrode 21.

The drain terminal electrode 30 includes the drain pad electrode 31 and the plurality of drain extraction electrodes 32. The drain terminal electrode 30 is formed in a manner of overlapping with the active region 53 (referring to FIG. 2) and the stripe wire 100 (referring to FIG. 7) in top view. The plurality of drain extraction electrodes 32 are extracted in a comb-like manner extending in the first direction X to the side of the third chip side surface 5C. As shown in FIG. 9, the plurality of drain extraction electrodes 32 may also be extracted in the second direction Y from the entire region of the drain pad electrode 31. The plurality of drain extraction electrodes 32 are engaged with the plurality of source extraction electrodes 22 at intervals in the first direction X.

The gate terminal electrode 40 is formed in a manner of overlapping with the peripheral region 54 (referring to FIG. 2) in top view. The gate terminal electrode 40 is shaped as a quadrilateral in top view.

The source terminal electrode 20, the drain terminal electrode 30 and the gate terminal electrode 40 include main electrodes formed by a metal layer. The metal layer includes pure Cu, pure Al (having a purity of 99% or more), AlSi, AlCu and AlSiCu. A first barrier layer and a second barrier layer may also be formed on the front surface and the back surface of the main electrode, respectively. The first barrier layer and the second barrier layer include at least one of Ti and TiN. The main electrode may also have a thickness greater than those of the first barrier layer and the second barrier layer.

The source pad electrode 21 avoided from a region in which the gate terminal electrode 40 in the first chip main surface 3 is formed in a region closer to the side of the third chip side surface 5C than the center in the first direction X. More specifically, the source pad electrode 21 is formed in a substantially in one-third of the region on the side of the third chip side surface 5C in the first chip main surface 3. The source terminal electrode 21 is substantially shaped as a quadrilateral in top view. More specifically, as shown in FIG. 9, the source terminal electrode 20 is opposite to the gate terminal electrode 40 and formed on the side of the first chip side surface 5A in the second direction Y, and is formed on the side of the fourth chip side surface 5D in the first direction X.

The source pad electrode 21 includes a first source pad region 46 shaped as a quadrilateral in top view, and is formed in a second source pad region 47 on the side of the second chip side surface 5B relative to an edge 40a of the side of the first chip side surface 5A (one side of the second direction Y) on the gate terminal electrode 40. The second source pad region 47 is substantially shaped as a trapezoid in top view. The first source pad region 46 and the second source pad region 47 are connected via a source pad connection portion 48.

As shown in FIG. 4 and FIG. 5, the source pad electrode 21 is electrically connected to the plurality of source wires 85 of the stripe wire 100 via the plurality of source upper contacts (first contacts) 98. The source pad electrode 21 is spaced by the second interlayer insulating layer 17 and thus electrically insulated from the drain wire 86.

The plurality of source upper contacts 98 are formed in the second interlayer insulating layer 17. The plurality of source upper contacts 98 are arranged between the source pad electrode 21 and the source wire 85. The plurality of source upper contacts 98 connect the source pad electrode 21 and the individual source wires 85. The plurality of source upper contacts 98 are arranged along the source wire 85. The source upper contact 98 includes a metal layer such as tungsten. A barrier layer (for example, including at least one of Ti and TiN) may also be formed on at least one of the front surface, the back surface and the side surface of the metal layer according to requirements.

An edge 21a of the side of the fourth chip side surface 5D on the source pad electrode 21 includes a linear portion 49 extending linearly in the second direction Y and an inclined portion 50. The inclined portion 50 is inclined relative to the second direction Y in a manner of approaching the side of the drain pad electrode 31 as getting closer to the side of the second chip side surface 5B. The edge 21a has the inclined portion 50, and thus it is ensured that a width W48 of the source pad connection portion 48 is larger.

The plurality of comb-like source extraction electrodes 22 have equal widths W22 in the second direction Y. The width W22 of the source extraction electrode 22 is greater than the width W85 of the source wire 85 (referring to FIG. 8). The width W22 of the source extraction electrode 22 is greater than a sum of the width W85 of the source wire 85 and the width W86 of the drain wire 86 (referring to FIG. 8). As shown in FIG. 10, the plurality of source extraction electrodes 22 overlap with at least one pair of the source wire 85 and the drain wire 86 (six pairs in the example shown in FIG. 10) when viewed from the top. An edge 22a of the side of the fourth chip side surface 5D on the source extraction electrode 22 is opposite by a narrower with to an edge 31a of the side of the third chip side surface 5C on the drain pad electrode 31.

As shown in FIG. 10 to FIG. 11B, the plurality of source extraction electrodes 22 are electrically connected to the plurality of source wires 85 of the stripe wire 100 via the source upper contacts 98. The plurality of source extraction electrodes 22 are spaced by the second interlayer insulating layer 17 and thus electrically insulated from the drain wire 86.

The plurality of source upper contacts 98 are arranged between the individual source extraction electrodes 22 and the individual source wires 85. The plurality of source upper contacts 98 connect the source pad electrode 21 and the individual source wires 85. The plurality of source upper contacts 98 are arranged along the source wire 85. As shown in FIG. 10 to FIG. 11B, the source upper contact 98 is formed in a region in the source extraction electrode 22 overlapping with the source wire 85. As shown in FIG. 10 to FIG. 11B, the source upper contact 98 is not formed in a region in the source extraction electrode 22 overlapping with the drain wire 86.

The source extraction electrode 22 extends in a zigzag form in the first direction X. The source extraction electrode 22 matches with the adjacent drain extraction electrode 32 (along the adjacent drain extraction electrode 32). The source extraction electrode 22 includes a first source extension portion (first extension portion) 23, a first source bent portion (first bent portion, third bent portion) 24 and a second source bent portion (first bent portion, fourth bent portion) 25. The first source extension portion 23 is extracted from the source pad electrode 21 to the side of the fourth chip side surface 5D, and extends in the first direction X. The first source bent portion 24 bends in the first source extension portion 23 to the side of the first chip side surface 5A (one side of the second direction Y), is extracted to the side of the fourth chip side surface 5D after bending, and extends in the first direction X. The second source bent portion 25 bends in the first source bent portion 24 to the side of the second chip side surface 5B, is extracted to the side of the fourth chip side surface 5D after bending, and extends in the first direction X.

The first source bent portion 24 extends in a bending direction of a second drain bent portion 35 of the adjacent drain extraction electrode 32 (to be described shortly). The first source bent portion 24 is electrically connected to the source upper contact 98. The first source bent portion 24 is spaced by the second interlayer insulating layer 17 and thus electrically insulated from the drain wire 86.

The first source bent portion 24 includes a second source extension portion (second extension portion) 26 and a first source connection portion 27. The second source extension portion 26 extends, in a region closer to the side of the fourth chip side surface 5D than the first source extension portion 23, in the first direction X from a position shifted to the side of the first chip side surface 5A relative to the first source extension 23. The second source extension portion 26 is shifted by a distance of one first source extension portion 23 to the side of the first chip side surface 5A relative to the first source extension portion 23. More specifically, an edge 26b of the side of the second chip side surface 5B on the second source extension portion 26 is aligned in the second direction Y with an edge 23a of the side of the first chip side surface 5A on the first source extension portion 23.

The second source extension portion 26 is opposite in the first direction X to the first drain extension portion 33 of the adjacent drain extraction electrode 32 on the side of the first chip side surface 5A. The second source extension portion 26 is not opposite in the first direction X to the first source extension portion 23 of the adjacent source extraction electrode 22 on the side of the first chip side surface 5A. The two edges (the edge 26a and the edge 26b) of the second source extension portion 26 are aligned in the second direction Y with two edges (an edge 33a and an edge 33b) of the first drain extension portion 33 of the adjacent drain extraction electrode 32 on the side of the first chip side surface 5A.

The first source connection portion 27 connects the first source extension portion 23 and the second source extension portion 26. The first source connection portion 27 is inclined relative to the second direction Y in a manner of approaching the side of the fourth chip side surface 5D as getting closer to the side of the first chip side surface 5A. The first source connection portion 27 horizontally passes through the plurality of source wires 85 and the plurality of drain wires 86 in top view.

The second source bent portion 25 extends in a bending direction of a first drain bent portion 34 of the adjacent drain extraction electrode 32 (to be described shortly). The second source bent portion 25 is electrically connected to the source upper contact 98. The second source bent portion 25 is spaced by the second interlayer insulating layer 17 and thus electrically insulated from the drain wire 86.

The second source bent portion 25 includes a third source extension portion (third extension portion) 28 and a second source connection portion 29. The third source bent portion 28 extends, in a region closer to the side of the fourth chip side surface 5D than the first source bent portion 24, in the first direction X from the first source extension portion 23 away from the fourth chip side surface 5D. The third source extension portion 28 is opposite to the first source extension portion 23 in the first direction X. The second source connection portion 29 connects the second source extension portion 26 and the third source extension portion 28. The second source connection portion 29 is inclined relative to the second direction Y in a manner of approaching the side of the fourth chip side surface 5D as getting closer to the side of the second chip side surface 5B. The second source connection portion 29 horizontally passes through the plurality of source wires 85 and the plurality of drain wires 86 in top view. With the first source bent portion 24 and the second source connection portion 29, a connection portion connecting the first source extension portion 23 and the third source extension portion 28 is formed.

With the first source bent portion 24 (the second source extension portion 26 and the first source connection portion 27) and the second source connection portion 29, a source protruding portion (protruding portion) 41 protruding to the side of the second chip side surface 5B (the other side in the second direction Y) is formed.

The source extraction electrode 22 includes a source recessed portion (recessed portion) 42 recessed toward the side of the first chip side surface 5A. The source recessed portion 42 is defined by an edge of the side of the second chip side surface 5B on the source protruding portion 41. The source recessed portion 42 matches with a drain protruding portion (protruding portion) 43 adjacent to the source recessed portion 42 on the side of the second chip side surface 5B, and accommodates the drain protruding portion 43. In other words, the source recessed portion 42 is engaged at an interval in the second direction Y with the adjacent drain protruding portion 43 on the side of the second chip side surface 5B.

Because the source recessed portion 42 matches with the adjacent drain protruding portion 43 on the side of the second chip side surface 5B, the length of the source protruding portion 41 in the first direction X is longer than the length of the adjacent drain protruding portion 43 in the first direction X on the side of the second chip side surface 5B by an amount of a wire width of the source extraction electrode 22. Thus, the length of the source protruding portion 41 in the first direction X is longer than the length of the adjacent drain protruding portion 43 in the first direction X on the side of the second chip side surface 5B.

The drain pad electrode 31 is formed in a region in the first chip main surface 3 closer to the side of the fourth chip side surface 5D than the center in the second direction Y. More specifically, the drain pad electrode 31 is formed in a substantially in one-third of the region in the first chip main surface 3 on the side of the fourth chip side surface 5D. The drain pad electrode 31 is shaped as a quadrilateral in top view. An edge 31a of the drain pad electrode 31 extends linearly in the second direction Y.

As shown in FIG. 6A and FIG. 6B, the drain pad electrode 31 is electrically connected to the plurality of drain wires 86 of the stripe wire 100 via a plurality of drain upper contacts (second contacts) 99. The drain pad electrode 31 is spaced by the second interlayer insulating layer 17 and thus electrically insulated from the drain wire 86.

The plurality of drain upper contacts 99 are formed in the second interlayer insulating layer 17. The plurality of drain upper contacts 99 are arranged between the drain pad electrode 31 and the drain wire 88. The plurality of drain upper contacts 99 connect the drain pad electrode 31 and the individual drain wires 86. The plurality of drain upper contacts 99 are arranged along the drain wire 86. The drain upper contact 99 includes a metal layer such as tungsten. A barrier layer (for example, including at least one of Ti and TiN) may also be formed on at least one of the front surface, the back surface and the side surface of the metal layer according to requirements.

The plurality of comb-like drain extraction electrodes 32 have equal widths W32 in the second direction Y. The width W32 of the drain extraction electrode 32 is greater than the width W86 of the drain wire 86 (referring to FIG. 8). The width W32 of the drain extraction electrode 32 is greater than a sum of the width W85 of the source wire 85 and the width W86 of the drain wire 86 (referring to FIG. 8). The width W32 of the drain extraction electrode 32 is equal to the width W22 of the source extraction electrode 22. The width W32 of the drain extraction electrode 32 may be greater than the width W22 of the source extraction electrode 22. The width W32 of the drain extraction electrode 32 may be smaller than the width W22 of the source extraction electrode 22.

As shown in FIG. 10, the plurality of drain extraction electrodes 32 overlap with at least one pair of the source wire 85 and the drain wire 86 (six pairs in the example shown in FIG. 10) when viewed from the top. An edge 32a of the drain extraction electrode 32 on the side of the third chip side surface 5C is opposite by a narrower width to the edge 21a of the source pad electrode 21. The plurality of drain extraction electrodes 32 are engaged with the plurality of source extraction electrodes 22 at least at the center in the first chip main surface 3 in the first direction X.

As shown in FIG. 10 to FIG. 11B, the plurality of drain extraction electrodes 32 are electrically connected to the plurality of drain wires 86 of the stripe wire 100 via the drain upper contacts 99. The drain extraction electrodes 32 are spaced by the second interlayer insulating layer 17 and thus electrically insulated from the drain wire 85.

The plurality of drain upper contacts 99 are arranged between the individual drain extraction electrodes 32 and the individual drain wires 86. The plurality of drain upper contacts 99 connect the drain pad electrode 31 and the individual drain wires 86. The plurality of drain upper contacts 99 are arranged along the drain wire 86. As shown in FIG. 10 to FIG. 11B, the drain upper contact 99 is formed in a region in the drain extraction electrode 32 overlapping with the drain wire 86. As shown in FIG. 10 to FIG. 11B, the drain upper contact 99 is not formed in a region in the drain extraction electrode 32 overlapping with the source wire 85.

The drain extraction electrode 32 extends in a zigzag form in the first direction X. The drain extraction electrode 32 matches with the adjacent source extraction electrode 22 (conforming to the adjacent source extraction electrode 22). The drain extraction electrode 32 includes a first drain extension portion 33, a first drain bent portion (second bent portion, third bent portion) 34 and a second drain bent portion 35. The first drain extension portion 33 is extracted from the drain pad electrode 31 to the side of the third chip side surface 5C, and extends in the first direction X.

The first drain bent portion 34 bends at the first drain extension portion 33 to the side of the first chip side surface 5A, is extracted to the side of the third chip side surface 5C after bending, and extends in the first direction X. The second drain bent portion 35 bends at the first drain bent portion 34 to the side of the second chip side surface 5B, is extracted to the side of the third chip side surface 5C after bending, and extends in the first direction X.

The first drain bent portion 34 extends in a bending direction of a second source bent portion 25 of the adjacent source extraction electrode 22. The first drain bent portion 34 is electrically connected to the drain upper contact 99. The first drain bent portion 34 is spaced by the second interlayer insulating layer 17 and thus electrically insulated from the source wire 85.

The first drain bent portion 34 includes a second drain extension portion 36 and a first drain connection portion 37. The second drain bent portion 36 extends, in a region closer to the side of the third chip side surface 5C than the first drain extension portion 33, in the first direction X from a position shifted to the side of the first chip side surface 5A relative to the first drain extension portion 33. The second drain extension portion 36 is shifted by a distance of one first drain extension portion 33 to the side of the first chip side surface 5A relative to the first drain extension portion 33. More specifically, an edge 36b of the second drain extension portion 36 on the side of the second chip side surface 5B is aligned in the second direction Y with an edge 33a of the first drain extension portion 33 on the side of the first chip side surface 5A.

The second drain extension portion 36 is opposite in the first direction X to the first source extension portion 23 of the adjacent source extraction electrode 22 on the side of the first chip side surface 5A. The second drain extension portion 36 is not opposite in the first direction X to the first drain extension portion 33 of the adjacent drain extraction electrode 32 on the side of the first chip side surface 5A. The two edges (the edge 36a and the edge 36b) of the second drain extension portion 36 are aligned in the second direction Y with the two edges (the edge 23a and the edge 23b) of the first source extension portion 23 of the adjacent source extraction electrode 22 on the side of the first chip side surface 5A.

The first drain connection portion 37 connects the first drain extension portion 33 and the second drain extension portion 36. The first drain connection portion 37 is inclined relative to the second direction Y in a manner of approaching the side of the third chip side surface 5C as getting closer to the side of the first chip side surface 5A. The first drain connection portion 37 horizontally passes through the plurality of source wires 85 and the plurality of drain wires 86 in top view.

The second drain bent portion 35 extends in a bending direction of the first source bent portion 24 of the adjacent source extraction electrode 22. The second drain bent portion 35 is electrically connected to the drain upper contact 99. The second drain bent portion 35 is spaced by the second interlayer insulating layer 17 and thus electrically insulated from the source wire 85.

The second drain bent portion 35 includes a third drain extension portion 38 and a second drain connection portion 39. The third drain bent portion 38 extends, in a region closer to the side of the third chip side surface 5C than the first drain bent portion 34, in the first direction X from the first drain extension portion 33 away from the side of the third chip side surface 5C. The third drain extension portion 38 is opposite to the first drain extension portion 33 in the first direction X. The second drain connection portion 39 connects the second drain extension portion 36 and the third drain extension portion 38. The second drain connection portion 39 is inclined relative to the second direction Y in a manner of approaching the side of the third chip side surface 5C as getting closer to the side of the second chip side surface 5B. The second drain connection portion 39 horizontally passes through the plurality of source wires 85 and the plurality of drain wires 86 in top view. With the first drain bent portion 34 and the second drain connection portion 39, a connection portion connecting the first drain extension portion 33 and the third drain extension portion 38 is formed.

With the first drain bent portion 34 (the second drain extension portion 36 and the first drain connection portion 37) and the second drain connection portion 39, a drain protruding portion 43 protruding to the side of the first chip side surface 5A is formed.

The drain extraction electrode 32 includes a drain recessed portion (recessed portion) 44 recessed toward the side of the first chip side surface 5A. The drain recessed portion 44 is defined by an edge of the side of the second chip side surface 5B on the drain protruding portion 43. The drain recessed portion 44 matches with a source protruding portion 41 adjacent to the drain recessed portion 44 on the side of the second chip side surface 5B, and accommodates the source protruding portion 41. In other words, the drain recessed portion 44 is engaged at an interval in the second direction Y with the adjacent source protruding portion 41 on the side of the second chip side surface 5B.

Because the drain recessed portion 44 matches with the adjacent source protruding portion 41 on the side of the second chip side surface 5B, the distance of the source protruding portion 43 in the first direction X is longer than the distance of the adjacent source protruding portion 41 in the first direction X on the side of the second chip side surface 5B by a wiring amount of the drain extraction electrode 32. Thus, the distance of the drain protruding portion 43 in the first direction X is longer than the distance of the adjacent source protruding portion 41 in the first direction X on the side of the second chip side surface 5B.

As described above, the distance of the source protruding portion 41 in the first direction X is longer than the distance of the adjacent drain protruding portion 43 in the first direction X on the side of the second chip side surface 5B. Moreover, the distance of the drain protruding portion 43 in the first direction X is longer than the distance of the adjacent source protruding portion 41 in the first direction X on the side of the second chip side surface 5B. Thus, the distances of the source protruding portion 41 and the drain protruding portion 43 in the first direction X increase as getting closer to the side of the second chip side surface 5B.

As shown above, according to the semiconductor device 1, the plurality of source extraction electrodes 22 are extracted in a comb-like manner extending in the first direction X from the source pad electrode 21 formed on the second interlayer insulating layer 17 to the side of the fourth chip side surface 5D. The plurality of source extraction electrodes 22 are electrically connected to the plurality of source wires 85 of the stripe wire 100 covered by the second interlayer insulating layer 17. Moreover, the plurality of drain extraction electrodes 32 are extracted in a comb-like manner extending in the first direction X from the drain pad electrode 31 covered by the second interlayer insulating layer 17 to the side of the third chip side surface 5C. The plurality of drain extraction electrodes 32 are electrically connected to the plurality of drain wires 86 of the stripe wire 100 covered by the second interlayer insulating layer 17. Moreover, the plurality of drain extraction electrodes 32 are engaged at intervals in the first direction X with the plurality of source extraction electrodes 22. The current path from the source pad electrode 21 to the stripe wire 100 can be shortened by using the source extraction electrode 22. Similarly, the current path from the drain pad electrode 31 to the stripe wire 100 can be shortened by using the drain extraction electrode 32. Thus, wiring resistance can be reduced.

Moreover, according to the semiconductor device 1, by forming the first source bent portion 24 (the source protruding portion 41 protruding in the second direction Y) bent in the second direction Y at the source extraction electrode 22, the number of source wires 85 electrically connected to the source extraction electrode 22 can be increased. Similarly, by forming the first drain bent portion 34 (the drain protruding portion 43 protruding in the second direction Y) bent in the second direction Y at the drain extraction electrode 32, the number of drain wires 86 electrically connected to the drain extraction electrode 32 can be increased. Thus, wiring resistance can be further reduced.

In addition, according to the semiconductor device 1, the source extraction electrode 22 is engaged at an interval in the second direction Y with the adjacent drain protruding portion 43 on the side of the second chip side surface 5B. Similarly, the drain extraction electrode 32 is engaged at an interval in the second direction Y with the adjacent source protruding portion 41 on the side of the second chip side surface 5B. Thus, without decreasing the wiring area of the source extraction electrode 22 and without decreasing the wiring area of the drain extraction electrode 32, the source protruding portion 41 and the drain protruding portion 43 are formed.

Moreover, according to the semiconductor device 1, by forming the third source extension portion 28 at the source extraction electrode 22, the current path shortened using the source extraction electrode 22 can be increased. Thus, the current path from the source pad electrode 21 to the stripe wire 100 can be shortened by using the source extraction electrode 22. Similarly, by forming the third drain extension portion 38 at the drain extraction electrode 32, the current path shortened using the drain extraction electrode 32 can be increased. Thus, the current path from the drain pad electrode 31 to the stripe wire 100 can be shortened by using the drain extraction electrode 32. Thus, wiring resistance can be further reduced.

Moreover, according to the semiconductor device 1, the edge 21a of the source pad electrode 21 has the inclined portion 50, and the inclined portion 50 is inclined in a manner of approaching the side of the drain pad electrode 31 as getting closer to the side of the second chip side surface 5B, hence ensuring that the width W48 of the source pad connection portion 48 is larger. Accordingly, the resistance of the source pad connection portion 48 of the source pad electrode 21 can be reduced. Thus, wiring resistance can be further reduced.

Figure 12:
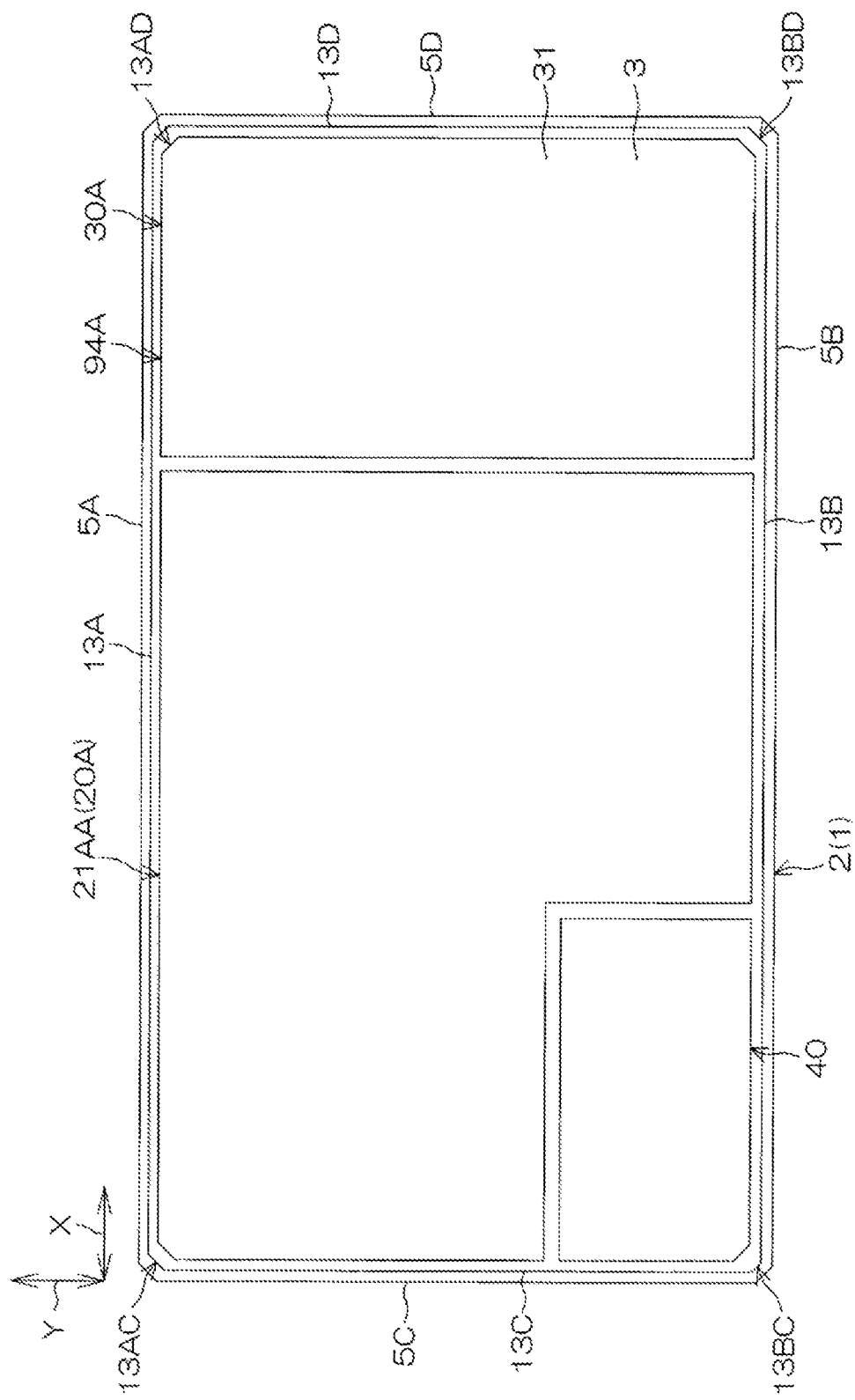
FIG. 12 is a diagram corresponding to FIG. 9 and represents a layout of a top wiring layer of a comparative embodiment.

FIG. 12 shows a diagram of a layout of a top wiring layer 94A of a comparative embodiment. FIG. 13 to FIG. 16 are diagrams of layouts of top wiring layers 94B to 94E of a first varied embodiment to a fourth varied embodiment of the present invention. FIG. 12 to FIG. 16 correspond to FIG. 9. In FIG. 12 to FIG. 16, structures having structure equivalent to those shown in FIG. 1 to FIG. 11B and reference numeral and symbols the same as those in the situations in FIG. 1 to FIG. 11B are omitted for brevity.

As shown in FIG. 12, the top wiring layer 94A of the comparative embodiment has a source terminal electrode 20A and a drain terminal electrode 30A. The source terminal electrode 20A includes a source pad electrode 21AA. The source pad electrode 21AA is avoided from a region in which the gate terminal electrode 40 in the first chip main surface 3 is formed and is formed in substantially two-thirds of a region on the side of the third chip side surface 5C. The source terminal electrode 20A does not include any source extraction electrode (equivalent to the source extraction electrode 22 in FIG. 9). The drain terminal electrode 30A includes the drain pad electrode 31 but does not include any drain extraction electrode (equivalent to the drain extraction electrode 32 in FIG. 9).

Figure 13:
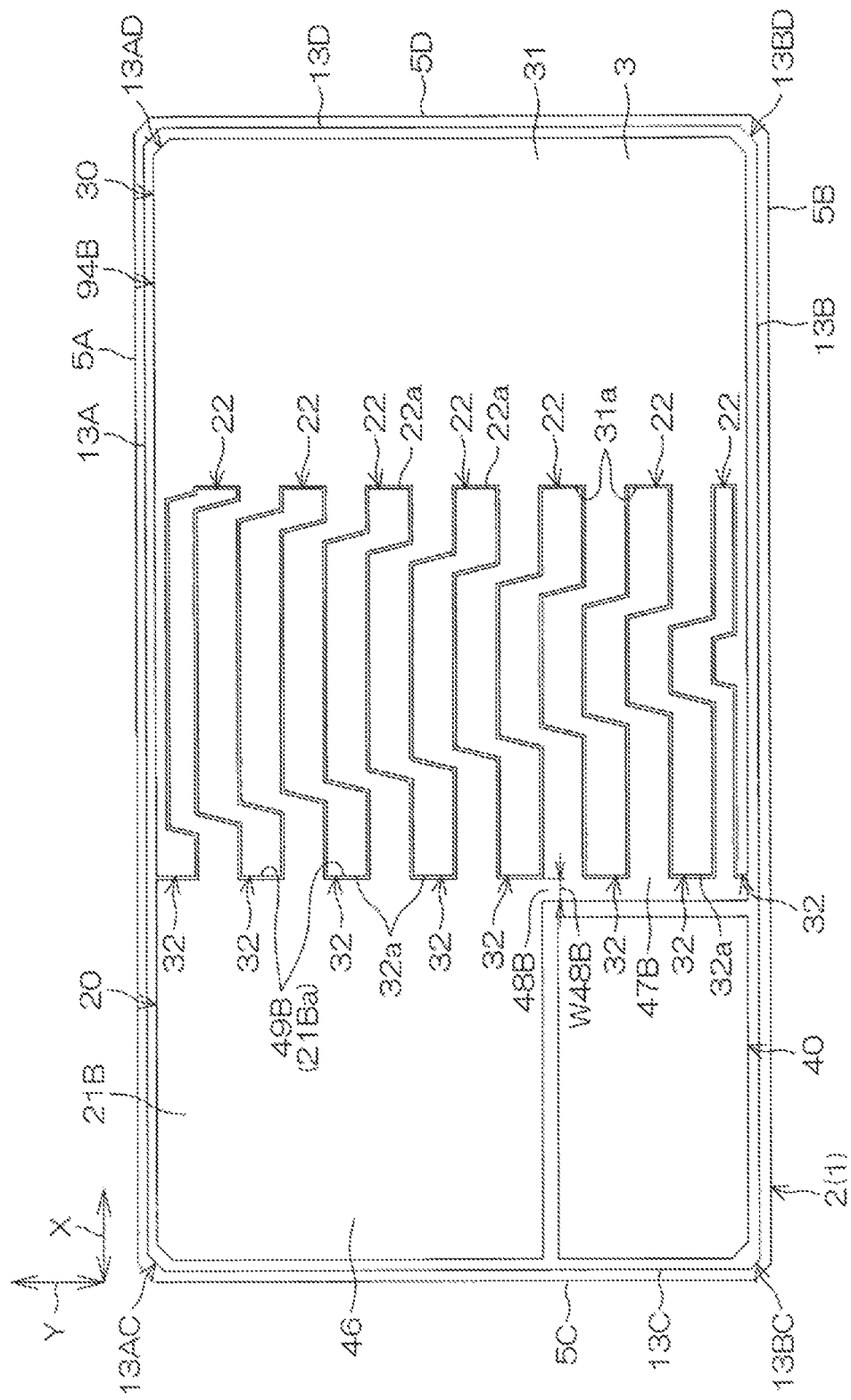
FIG. 13 is a diagram corresponding to FIG. 9 and represents a layout of a top wiring layer of a first varied embodiment.

As shown in FIG. 13, the top wiring layer 94B of the first varied embodiment includes a source pad electrode 21B as substitution for the source pad electrode 21 (referring to FIG. 9). An edge 21Ba of a source pad electrode 21B is formed merely by a linear portion 49 extending linearly in the second direction Y. Thus, a second source pad region 47B shaped as a strip in top view is used as substitution for the second source pad region 47. The first source pad region 46 and the second source pad region 47B are electrically connected via a source pad connection portion 48B.

In the source pad electrode 21B, the edge 21Ba does not have any inclined portion (equivalent to the inclined portion 50 in FIG. 9). Thus, a width W48B of the source pad connection portion 48B in the source pad electrode 21B is smaller than the width W48 (referring to FIG. 9) of the source pad connection portion 48 in the source pad electrode 21 (referring to FIG. 9). Other structures of the top wiring layer 94B are the same as those of the top wiring layer 94 (referring to FIG. 9).

Figure 14:
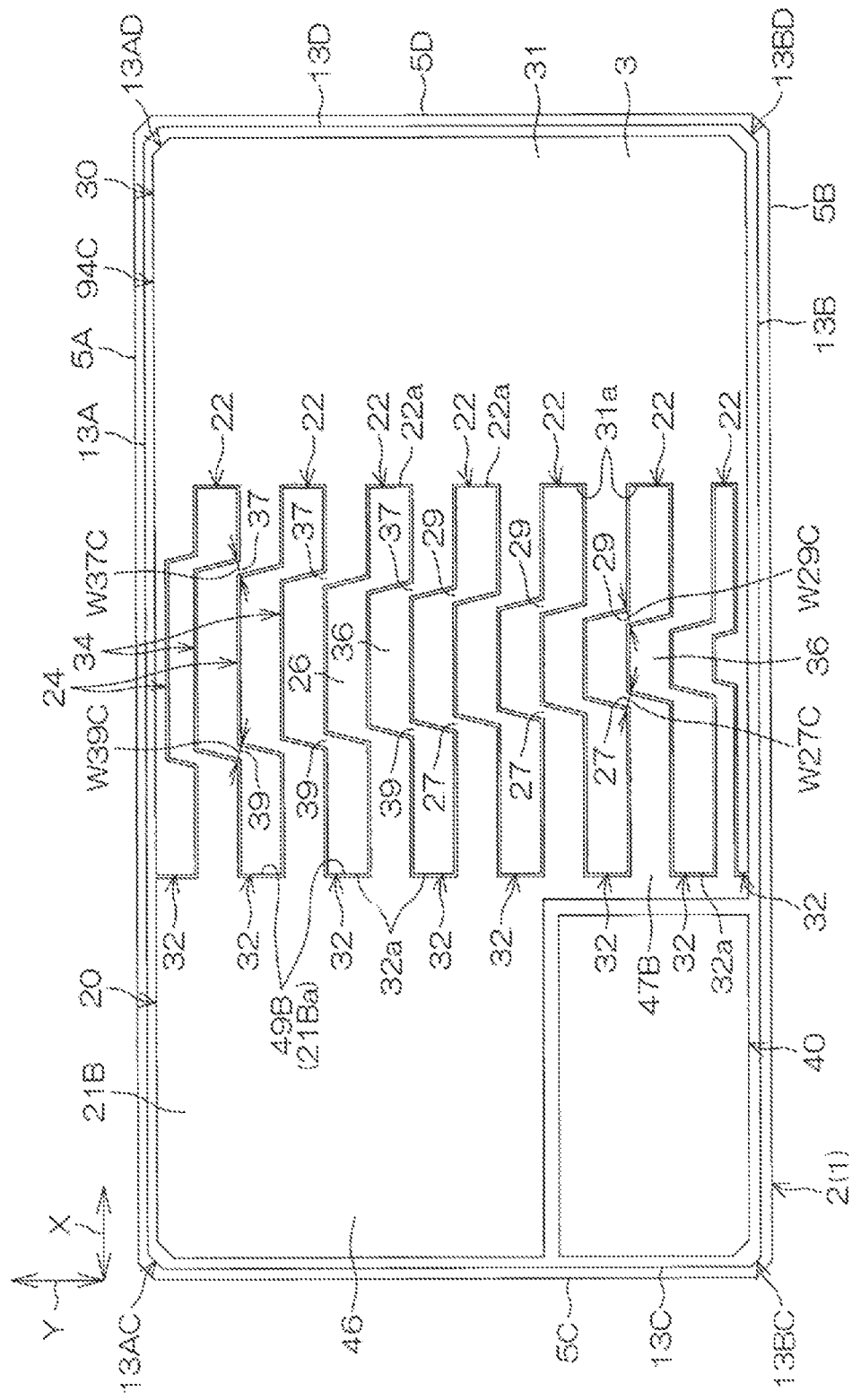
FIG. 14 is a diagram corresponding to FIG. 9 and represents a layout of a top wiring layer of a second varied embodiment.

As shown in FIG. 14, in the top wiring layer 94C of the second varied embodiment, the distance between the first source bent portion 24 and the first drain bent portion 34 in the first direction X (that is, the distance between the second source extension portion 26 and the second drain extension portion in the first direction X) is shorter than that in the top wiring layer 94 (referring to FIG. 9). Moreover, in the top wiring layer 94C, widths W27C and W29C (for example, each being 3 μm) of the first source connection portion 27 and the second source connection portion 29 are shorter than the widths W27 and W29 (referring to FIG. 9, for example, each being 9 μm) of the first source connection portion 27 and the second source connection portion 29 in the top wiring layer 94. Moreover, in the top wiring layer 94C, widths W37C and W39C (for example, each being 3 μm) of the first drain connection portion 37 and the second drain connection portion 39 are shorter than the widths W37 and W39 (referring to FIG. 9, for example, each being 9 μm) of the first drain connection portion 37 and the second drain connection portion 39 in the top wiring layer 94.

Figure 15:
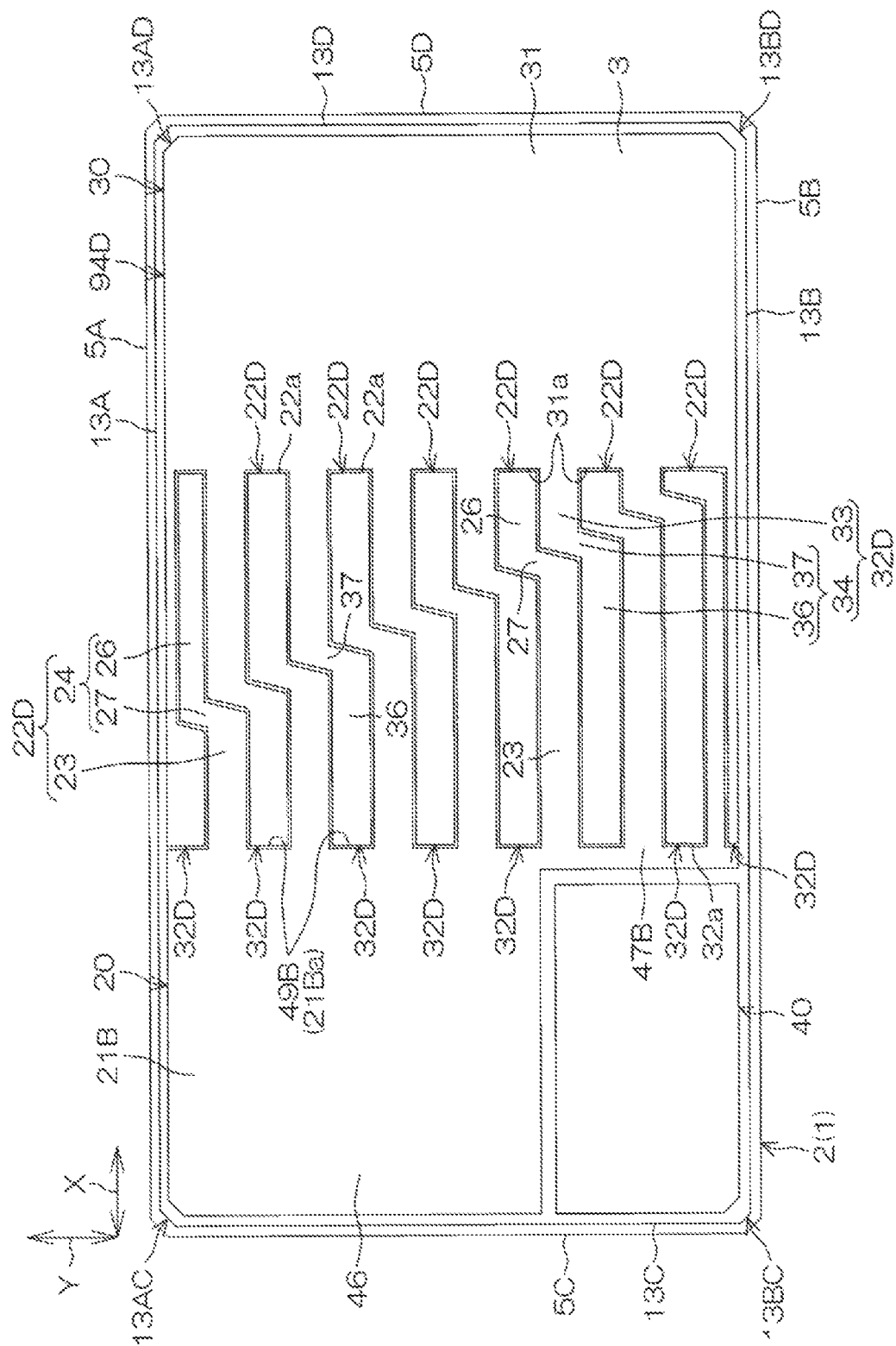
FIG. 15 is a diagram corresponding to FIG. 9 and represents a layout of a top wiring layer of a third varied embodiment.

As shown in FIG. 15, the top wiring layer 94D of the third varied embodiment includes a plurality of source extraction electrode 22D as substitution for the plurality of source extraction electrodes 22. Similarly, the top wiring layer 94D of the third varied embodiment includes a plurality of drain extraction electrode 32D as substitution for the plurality of drain extraction electrodes 32.

The source extraction electrode 22D does not include any second source bent portion (equivalent to the second source bent portion 25 in FIG. 9). Moreover, the drain extraction electrode 32D does not include any second drain bent portion (equivalent to the second drain bent portion 35 in FIG. 9).

Figure 16:
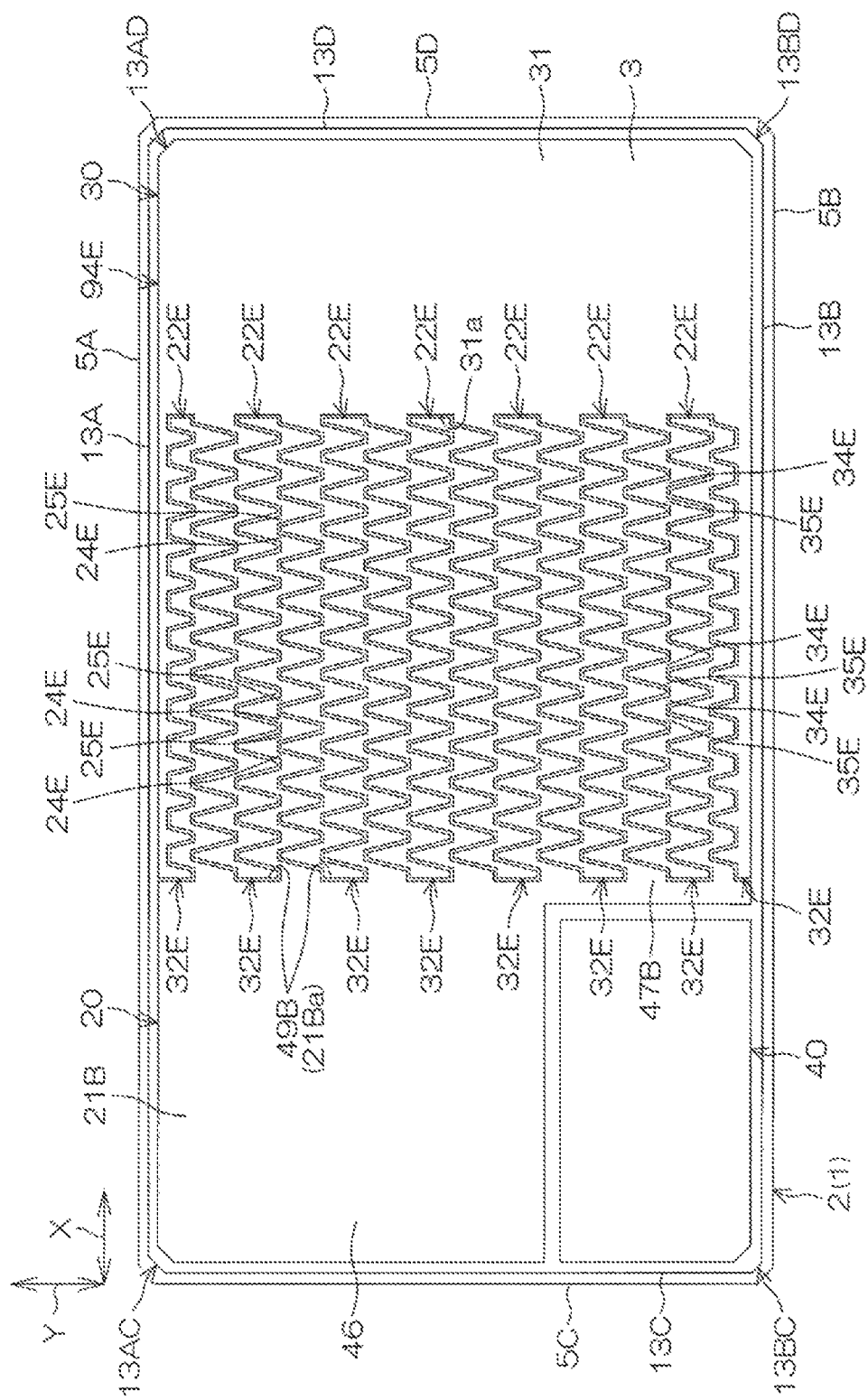
FIG. 16 is a diagram corresponding to FIG. 9 and represents a layout of a top wiring layer of a fourth varied embodiment.

As shown in FIG. 16, the top wiring layer 94E of the fourth varied embodiment includes a plurality of source extraction electrode 22E as substitution for the plurality of source extraction electrodes 22. Similarly, the top wiring layer 94E of the fourth varied embodiment includes a plurality of drain extraction electrode 32E as substitution for the plurality of drain extraction electrodes 32.

The source extraction electrode 22E includes a plurality of first source bent portions (first bent portion, third bent portion) 24E and second source bent portions (first bent portion, fourth bent portion) 25E alternately repeated in the first direction. X. The first source connection portion 24E is inclined relative to the second direction Y in a manner of approaching the side of the first chip side surface 5A as getting closer to the side of the fourth chip side surface 5D. The second source bent portion 25E is inclined relative to the second direction Y in a manner of approaching the side of the second chip side surface 5B as getting closer to the side of the fourth chip side surface 5D. The first source bent portion 24E and the second source bent portion 25E are electrically connected to the source wire 85 (referring to FIG. 10).

The drain extraction electrode 32E includes a plurality of first drain bent portions (second bent portion, third bent portion) 34E and second drain bent portions 35E alternately repeated in the first direction. X. The first drain connection portion 34E is inclined relative to the second direction Y in a manner of approaching the side of the first chip side surface 5A as getting closer to the side of the third chip side surface 5C. The second drain bent portion 35E is inclined relative to the second direction Y in a manner of approaching the side of the second chip side surface 5B as getting closer to the side of the third chip side surface 5C. The first drain bent portion 34E and the second drain bent portion 35E are electrically connected to the drain wire 86 (referring to FIG. 10).

According to the second varied embodiment to the fourth varied embodiment, effects and functions equivalent to the effects and functions described in the associated embodiment (referring to FIG. 9) are achieved.

Moreover, similar to the top wiring layer 94B of the first varied embodiment, the top wiring layers 94C to 94E of the second to fourth varied embodiments include the source pad electrode 21B as substitution for the source pad electrode 21 (referring to FIG. 9). The top wiring layers 94C to 94E may also include the source pad electrode 21 but not the source pad electrode 21B.

Table-1 indicates wiring resistance of the top wiring layers 94 to 94E of the embodiment (referring to FIG. 9), the comparative embodiment, and the first to fourth varied embodiments. Table-1 shows values when the wiring resistance of the top wiring layer 94A of the comparative embodiment is set as 1 (100%).

TABLE 1

| | Wiring resistance (%) |
|---|---|
| Embodiment (FIG. 9) | 62% |
| Comparative embodiment (FIG. 12) | 100% |
| First varied embodiment (FIG. 13) | 65% |
| Second varied embodiment (FIG. 14) | 66% |
| Third varied embodiment (FIG. 15) | 69% |
| Fourth varied embodiment (FIG. 16) | 85% |

It is known from Table-1 that, the wiring resistance of the top wiring layers 94 of the embodiment (referring to FIG. 9) is the lowest. The wiring resistance of the top wiring layer 94B of the first varied embodiment (referring to FIG. 13) is the second lowest, and then the wiring resistance of the top wiring layer 94C of the second varied embodiment (referring to FIG. 14).

Figure 17:
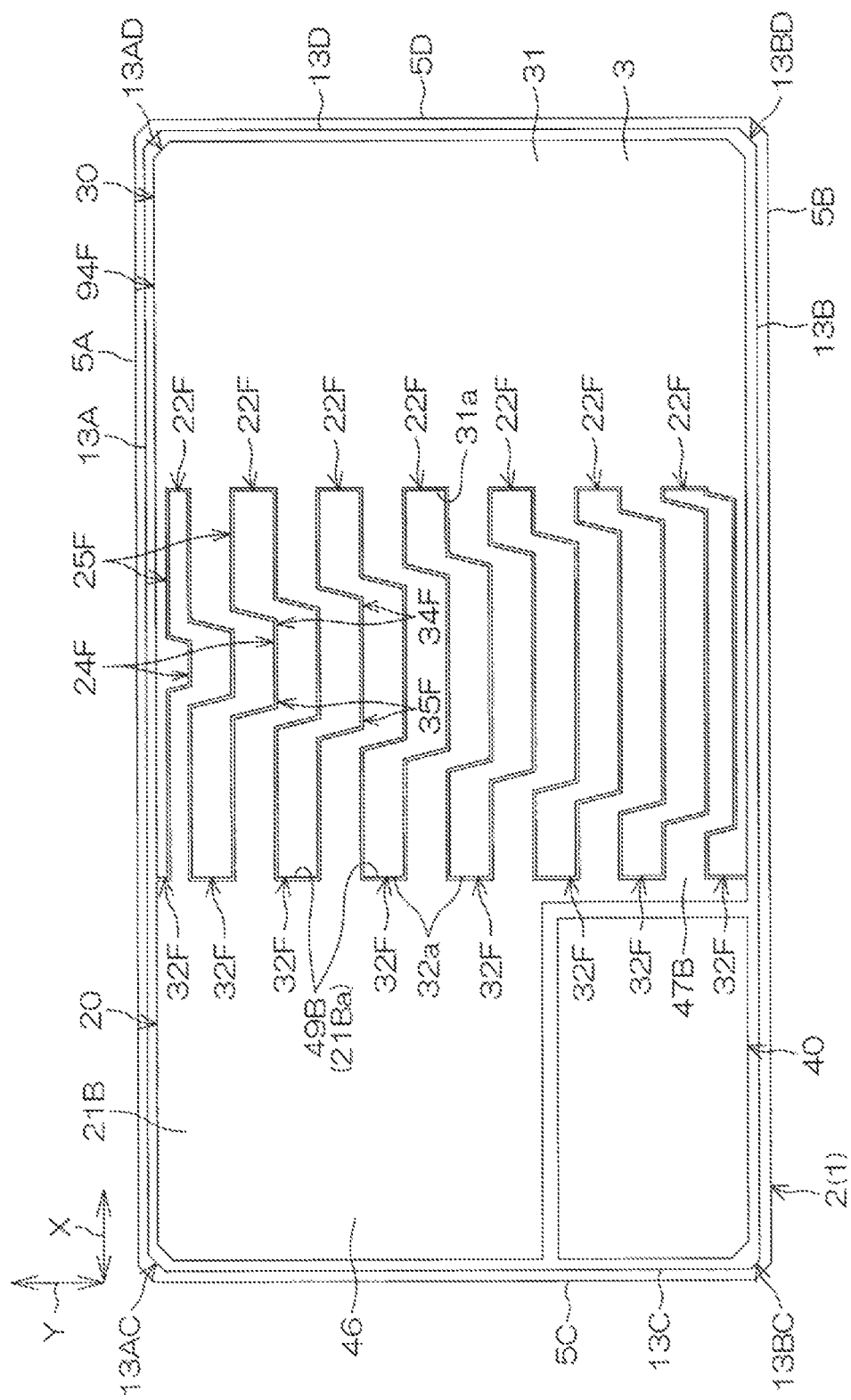
FIG. 17 is a diagram corresponding to FIG. 9 and represents a layout of a top wiring layer of a fifth varied embodiment.
Figure 18:
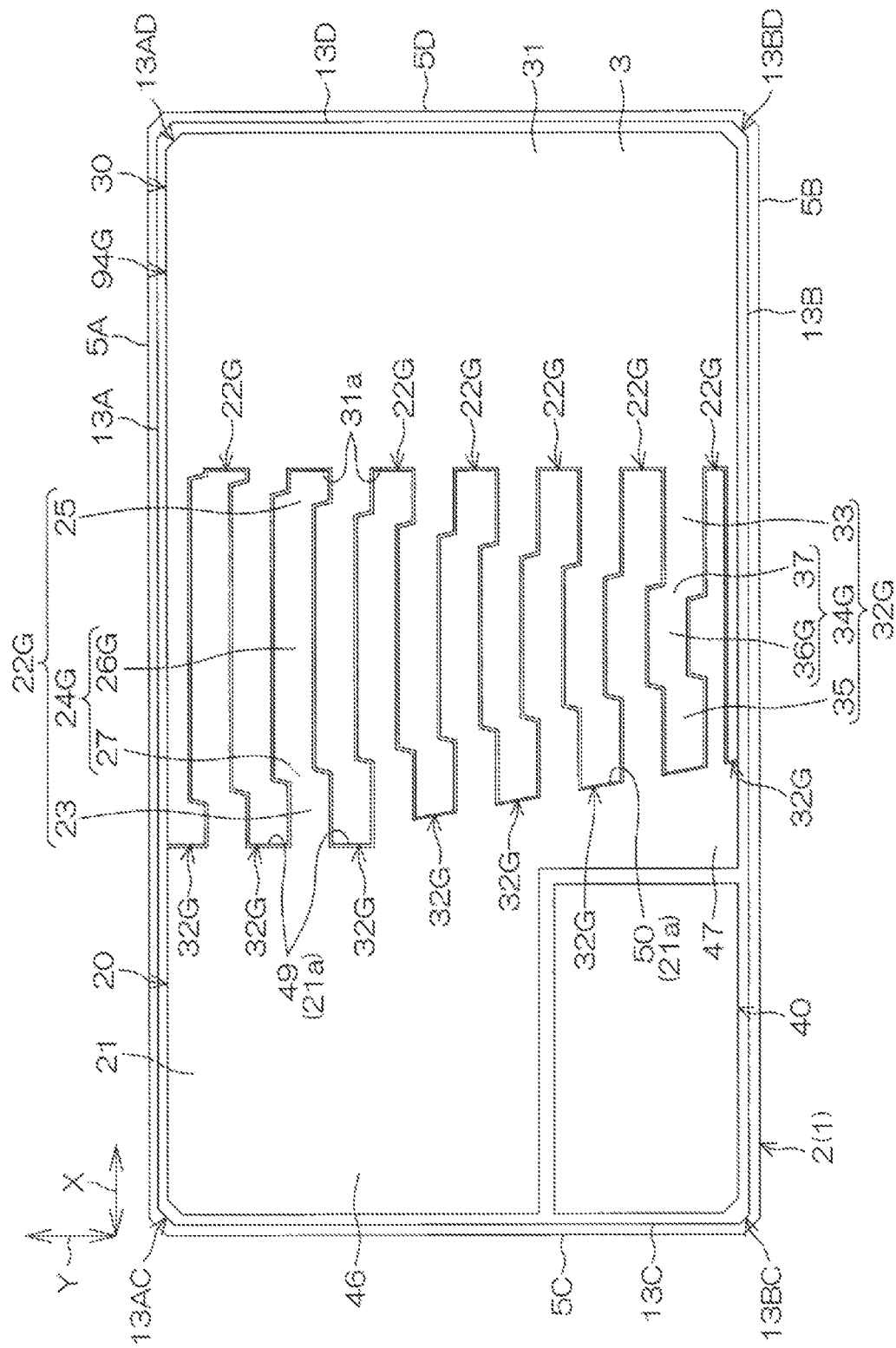
FIG. 18 is a diagram corresponding to FIG. 9 and represents a layout of a top wiring layer of a sixth varied embodiment.
Figure 19:
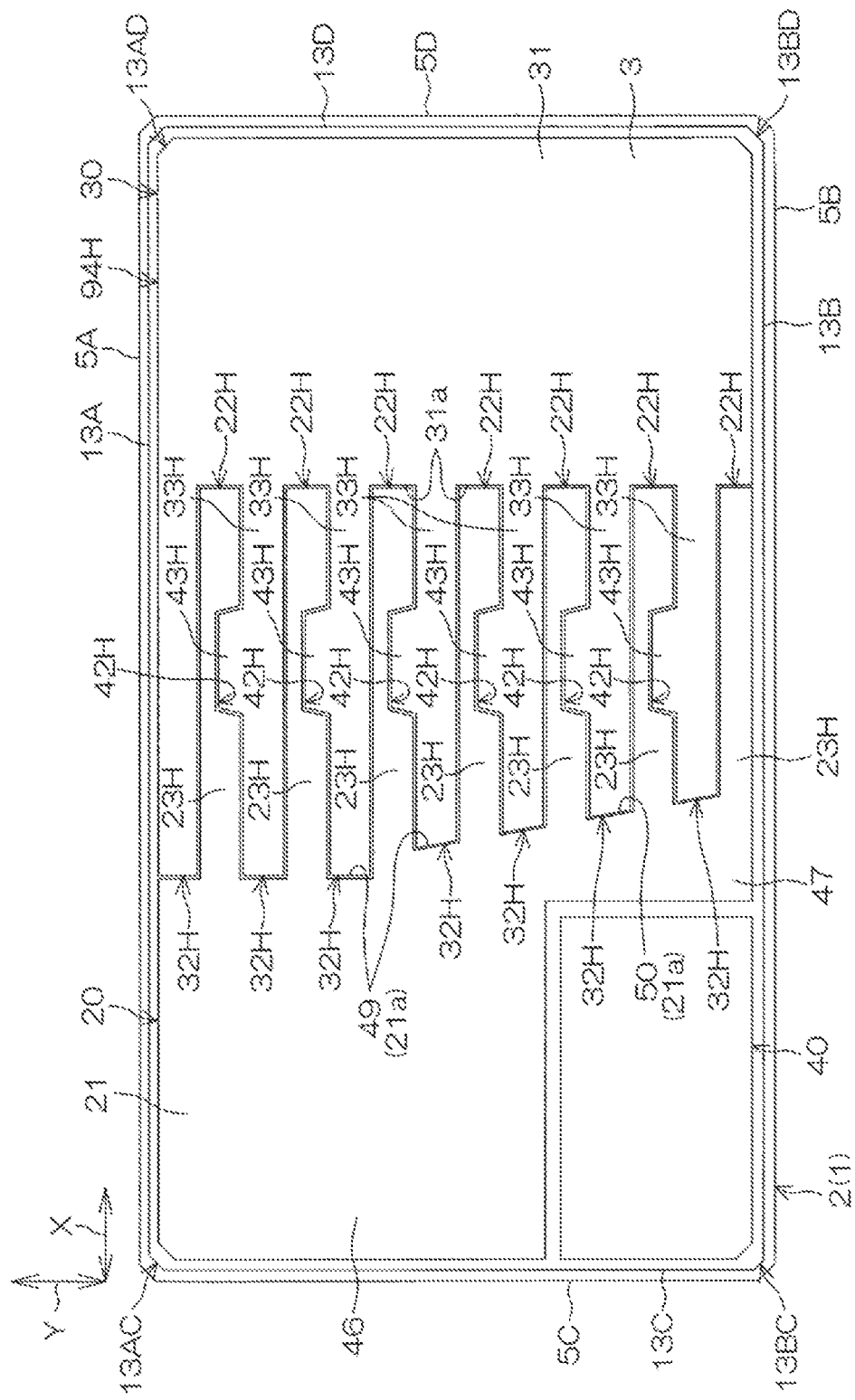
FIG. 19 is a diagram corresponding to FIG. 9 and represents a layout of a top wiring layer of a seventh varied embodiment.

FIG. 17 to FIG. 19 are diagrams of layouts of top wiring layers 94F to 94H of fifth to seventh varied embodiments of the present invention. FIG. 17 to FIG. 19 correspond to FIG. 9.

As shown in FIG. 17, the top wiring layer 94F of the fifth varied embodiment includes a plurality of source extraction electrodes 22F as substitution for the plurality of source extraction electrodes 22. The source extraction electrode 22F includes a first source extension portion 23, a first source bent portion (first bent portion, third bent portion) 24F and a second source bent portion (first bent portion, fourth bent portion) 25F. The bending direction of the first source bent portion 24F and the second source bent portion 25F is opposite in the second direction Y to the bending direction of the first source bent portion 24F and the second source bent portion 25F of the embodiment (referring to FIG. 9).

The top wiring layer 94F of the fifth varied embodiment includes a plurality of drain extraction electrodes 32F as substitution for the plurality of drain extraction electrodes 32. The drain extraction electrode 32 includes a first drain extension portion 33, a first drain bent portion (second bent portion, third bent portion) 34F and a second drain bent portion 35F. The bending direction of the first drain bent portion 34F and the second drain bent portion 35F is opposite in the second direction Y to the bending direction of the first drain bent portion 34F and the second drain bent portion 35F of the embodiment (referring to FIG. 9).

As shown in FIG. 18, the top wiring layer 94G of the sixth varied embodiment includes a plurality of source extraction electrodes 22G as substitution for the plurality of source extraction electrodes 22. The source extraction electrode 22G includes a first source extension portion 23, a first source bent portion (first bent portion, third bent portion) 24G and a second source bent portion 25.

The first source bent portion 24G includes a second source extension portion 26G and a first source connection portion 27. The second source extension portion 26G on one hand is shifted to the side of the first chip side surface 5A relative to the first source extension portion 23 and on the other hand extends in the first direction X. The second source extension portion 26G is shifted by a distance of one-half of the first source extension portion 23 to the side of the first chip side surface 5A relative to the first source extension portion 23.

The top wiring layer 94G of the sixth varied embodiment includes a plurality of drain extraction electrodes 32G as substitution for the plurality of drain extraction electrodes 32. The drain extraction electrode 32G includes a first drain extension portion 33, a first drain bent portion (second bent portion, third bent portion) 34G and a second drain bent portion 35. The first drain bent portion 34G includes a second drain extension portion 36G and a first drain connection portion 37. The second drain extension portion 36G on one hand is shifted to the side of the first chip side surface 5A relative to the first drain extension portion 33 and on the other hand extends in the first direction X. The second drain extension portion 36G is shifted by a distance of one-half of the first drain extension portion 33 to the side of the first chip side surface 5A relative to the first drain extension portion 33.

As shown in FIG. 19, the top wiring layer 94H of the seventh varied embodiment includes a plurality of source extraction electrodes 22H as substitution for the plurality of source extraction electrodes 22. Similarly, the top wiring layer 94H of the fourth varied embodiment includes a plurality of drain extraction electrodes 32H as substitution for the plurality of drain extraction electrodes 32.

The plurality of drain extraction electrodes 32 include first drain extension portions 33H and drain protruding portions 43H. The first drain extension portion 33H is extracted from the drain pad electrode 31 to the side of the third chip side surface 5C, and extends in the first direction X. The drain protruding portion 43H protrudes from an intermediate portion of the first drain extension portion 33H to the side of the first chip side surface 5A.

The source extraction electrode 22H includes a first source extension portion 23H and a source recessed portion 42H. The first source extension portion 23H is extracted from the source pad electrode 21 to the side of the fourth chip side surface 5D, and extends in the first direction X. The source recessed portion 42H is defined by an edge of the side of the second chip side surface 5B on the first source extension portion 23H.

The source recessed portion 42H matches with the drain protruding portion 43H of the adjacent drain extraction electrode 32H on the side of the second chip side surface 5B, and engages with the drain protruding portion 43H in the second direction.

In the example shown in FIG. 19, the drain protruding portion 43H may also protrude to the side of the second chip side surface 5B but not to the side of the first chip side surface 5A. In this case, the source recessed portion 42H engaging with the drain protruding portion 43H is formed in the second direction Y on the edge of the first chip side surface 5A of the source extraction electrode 22H adjacent drain protruding portion 43H on the side of the second chip side surface 5B.

Moreover, the combination of the source and the drain of the protruding portion and the recessed portion may be opposite to the example shown in FIG. 19. A protruding portion (that is, the source protruding portion) may also be formed at the first source extension portion 23H of the source extraction electrode 22H, and a recessed portion (that is, the drain recessed portion) engaging in the second direction Y with the protruding portion may be formed at the first drain extension portion 33H of the drain extraction electrode 32H.

According to the fifth varied embodiment to the seventh varied embodiment, effects and functions equivalent to the effects and functions described in the associated embodiment (referring to FIG. 9) are achieved.

Further, the drain wire 86 may be not commonly connected to the drain regions 68 of the well regions 66 included by the adjacent unit cells 60, but the drain wire 86 is connected to only one of the drain regions 68. That is, the drain wires 86 and the drain regions 68 are formed in one-on-one correspondence. In this case, in the stripe wire 100, a plurality of source wires 85 and a plurality of drain wires 86 are arranged in the second direction Y according to an order of the drain wire 86, the source wire 85, the drain wire 86, the drain wire 86, the source wire 85, the drain wire 86, the drain wire 86 . . . .

For example, the semiconductor chip 10 is not necessarily shaped as a rectangle in top view, but may also be other quadrilaterals such as a square in top view.

In the forms above, a structure without the side surface insulating layer 15 may be adopted. In this case, the side surfaces 13A to 13D of the semiconductor chip 10 form parts of the chip side surfaces 5A to 5D of the chip body 2, respectively.

Moreover, in the embodiment, the element built-in the semiconductor device 1 is not limited to a MOSFET structure, and other elements such as an insulated gate bipolar transistor (IGBT) or a bipolar transistor may be adopted.

In addition, various design modifications may be implemented within the scope of the items stated by the claims.

The invention claimed is:

1. A semiconductor device, comprising:
a first insulating layer;
a stripe wire, comprising a plurality of first wires and a plurality of second wires, each of the plurality of first wires and the plurality of second wires extending in a first direction on the first insulation layer and arranged at intervals in a second direction intersecting the first direction, wherein the stripe wire has a first end portion on one side of the first direction and a second end portion on the other side of the first direction;
a second insulating layer, covering the stripe wire on the first insulating layer;
a first pad electrode, arranged on the second insulating layer and on a side of the first end portion of the stripe wire, and electrically connected to the plurality of first wires;
a plurality of first extraction electrodes, extracted in a comb-like manner from the first pad electrode to a side of the second end portion of the stripe wire on the second insulating layer, electrically connected to the plurality of first wires on a side of the second end portion of the stripe wire relative to the first pad electrode;
a second pad electrode, arranged on the second insulating layer and on a side of the second end portion of the stripe wire, and electrically connected to the plurality of second wires; and
a plurality of second extraction electrodes, extracted engagingly with the plurality of first extraction electrodes on the second insulating layer, in a comb-like manner from the second pad electrode to the side of the first end portion of the stripe wire, and electrically connected to the plurality of second wires on the side of the first end portion of the stripe wire relative to second pad electrode.

2. The semiconductor device according to claim 1, wherein the first extraction electrode is electrically insulated from the plurality of second wires, and the second extraction electrode is electrically insulated from the plurality of first wires.

3. The semiconductor device according to claim 1, wherein the stripe wire comprises a plurality of pairs of the first wires and the second wires, and at least one of the first extraction electrodes and the second extraction electrodes overlaps with at least one pair of the first wires and the second wires in a top view.

4. The semiconductor device according to claim 1, wherein the first extraction electrode comprises a first bent portion bending in the second direction, and the second extraction electrode comprises a second bent portion extending in a bending direction of the first bent portion.

5. The semiconductor device according to claim 4, further comprising:
a first contact, formed in the second insulating layer, electrically connecting the first wire and the first pad electrode; and
a second contact, formed in the second insulating layer, electrically connecting the second wire and the second pad electrode, wherein
the first bent portion is electrically connected to the first contact, and is separated by the second insulating layer and electrically insulated from the second wire, and wherein
the second bent portion is electrically connected to the second contact, and is separated by the second insulating layer and electrically insulated from the second wire.

6. The semiconductor device according to claim 4, wherein the first bent portion horizontally passes through the plurality of first wires and the plurality of second wires in a top view, and the second bent portion horizontally passes through the plurality of first wires and the plurality of second wires in a top view.

7. The semiconductor device according to claim 4, wherein the first extraction electrode comprises a plurality of the first bent portions, and the second extraction electrode comprises a plurality of the second bent portions.

8. The semiconductor device according to claim 7, wherein the first extraction electrode extends in a zigzag form in the first direction, and the second extraction electrode and the first extraction electrode extend correspondingly in the first direction in a zigzag form.

9. The semiconductor device according to claim 4, wherein
the first extraction electrode further comprises a first extension portion extending in the first direction from the first pad electrode,
the first bent portion comprises a third bent portion bending from the first extension portion to one side of the second direction, and
the second extraction electrode further comprises a recessed portion recessed toward the one side of the second direction and engaged with the third bent portion.

10. The semiconductor device according to claim 9, wherein the third bent portion comprises a second extension portion that is closer to the side of the second end portion than the first extension portion and extends in the first direction from a position shifted to the one side of the second direction with respect to the first extension portion.

11. The semiconductor device according to claim 10, wherein the second extension portion is opposite to the second extraction electrode in the first direction.

12. The semiconductor device according to claim 11, wherein the second extension portion is back onto the first extension portion of the first extraction electrode that is adjacent to the one side in the first direction.

13. The semiconductor device according to claim 9, wherein the first bent portion further comprises a fourth bent portion bending to another side of the second direction.

14. The semiconductor device according to claim 13, wherein the fourth bent portion comprises a third extension portion that is closer to the side of the second end portion than the third bent portion and extends in the first direction from the first extension portion away from the side of the second end portion.

15. The semiconductor device according to claim 14, wherein the third extension portion is opposite to the first extension portion in the first direction.

16. The semiconductor device according to claim 1, further comprising:
a semiconductor chip, having a main surface; and
a field-effect transistor, formed on the main surface and comprising a plurality of unit cells extending in the first direction, wherein
the first insulating layer covers the plurality of unit cells,
the first wire comprises one of a source wire and a drain wire, and
the second wire comprises the other of the source wire and the drain wire.

17. The semiconductor device according to claim 16, wherein the unit cell has a planar gate structure.

18. The semiconductor device according to claim 16, wherein the first wire comprises the source wire, the second wire comprises the drain wire, the first pad electrode comprises a source pad electrode electrically connected to the plurality of source wires, the second pad electrode comprises a drain pad electrode electrically connected to the plurality of drain wires, and a part of the source pad electrode opposite to the drain pad electrode comprises a linear portion extending in the second direction and an inclined portion inclined relative to the linear portion.

19. A semiconductor device, comprising:
a first insulating layer;
a stripe wire, comprising a plurality of first wires and a plurality of second wires, each of the plurality of first wires and the plurality of second wires extending in a first direction on the first insulation layer and arranged at intervals in a second direction intersecting the first direction, wherein the stripe wire has a first end portion on one side of the first direction and a second end portion on the other side in the first direction;
a second insulating layer, covering the stripe wire on the first insulating layer;
a first pad electrode, disposed on a side of the first end portion of the stripe wire on the second insulating layer, and electrically connected to the plurality of first wires;
a first extraction electrode, extracted in the first direction from the first pad electrode to a side of the second end portion of the stripe wire on the second insulating layer, opposite to the first pad electrode and electrically connected to the plurality of first wires on the side of the second end portion of the stripe wire;
a second pad electrode, disposed on the side of the second end portion of the stripe wire on the second insulating layer, and electrically connected to the plurality of second wires; and
a second extraction electrode, extracted in the first direction from the second pad electrode to a side of the first end portion of the stripe wire on the second insulating layer, and electrically connected to the plurality of second wires on the side of the first end portion of the stripe wire relative to the second pad electrode,
wherein one of the first extraction electrode and the second extraction electrode comprises a protruding portion protruding in the second direction, and the other one of the first extraction electrode and the second extraction electrode comprises a recessed portion recessed toward one side of the second direction and engaged with the protruding portion.

20. A semiconductor device, comprising:
a first insulating layer;
a stripe wire, comprising a plurality of first wires and a plurality of second wires, each of the plurality of first wires and the plurality of second wires extending in a first direction on the first insulation layer and arranged at intervals in a second direction intersecting the first direction, wherein the stripe wire has a first end portion on one side of the first direction and a second end portion on one other side in the first direction;
a second insulating layer, covering the stripe wire on the first insulating layer;
a first pad electrode, disposed on a side of the first end portion of the stripe wire on the second insulating layer, and electrically connected to the plurality of first wires;
a first extraction electrode, extracted in the first direction from the first pad electrode to a side of the second end portion of the stripe wire on the second insulating layer, and electrically connected to the plurality of first wires on the side of the second end portion of the stripe wire relative to the first pad electrode;
a second pad electrode, disposed on the side of the second end portion of the stripe wire on the second insulating layer, and electrically connected to the plurality of second wires; and
a second extraction electrode, extracted in the first direction from the second pad electrode to a side of the first end portion of the stripe wire on the second insulating layer, and electrically connected to the plurality of second wires on the side of the first end portion of the stripe wire relative to the second pad electrode,
wherein at least one of the first extraction electrode and the second extraction electrode comprises:
a first extension portion, extending in the first direction;
a third extension direction, extending in the first direction from the first extension portion to a side of the second end portion or away from a side of the first end portion; and
a connection portion, connecting the first extension portion and the third extension portion.

* * * * *